(12) United States Patent
Kawashima et al.

(10) Patent No.: US 8,344,444 B2
(45) Date of Patent: Jan. 1, 2013

(54) SEMICONDUCTOR DEVICE HAVING A NONVOLATILE MEMORY CELL WITH A CAP INSULATING FILM FORMED OVER A SELECTION GATE ELECTRODE

(75) Inventors: Yoshiyuki Kawashima, Tokyo (JP); Keiichi Haraguchi, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 151 days.

(21) Appl. No.: 12/699,731

(22) Filed: Feb. 3, 2010

(65) Prior Publication Data
US 2010/0200909 A1 Aug. 12, 2010

(30) Foreign Application Priority Data
Feb. 9, 2009 (JP) ................................. 2009-027604

(51) Int. Cl.
*H01L 29/792* (2006.01)
(52) U.S. Cl. ........ 257/324; 257/296; 257/411; 257/316; 438/257; 438/591
(58) Field of Classification Search .................. 257/324, 257/296, 411, 316; 438/257, 591
See application file for complete search history.

(56) References Cited

U.S. PATENT DOCUMENTS

| | | | |
|---|---|---|---|
| 5,585,293 A * | 12/1996 | Sharma et al. | 438/261 |
| 7,087,955 B2 | 8/2006 | Kawashima et al. | |
| 7,115,954 B2 | 10/2006 | Shimizu et al. | |
| 2003/0198086 A1 * | 10/2003 | Shukuri | 365/185.18 |
| 2004/0119107 A1 * | 6/2004 | Hisamoto et al. | 257/314 |
| 2004/0166630 A1 * | 8/2004 | Ogura et al. | 438/257 |
| 2005/0269650 A1 * | 12/2005 | Pidin | 257/411 |
| 2005/0272198 A1 * | 12/2005 | Hamamura et al. | 438/230 |
| 2006/0028868 A1 | 2/2006 | Okazaki et al. | |
| 2006/0035435 A1 | 2/2006 | Yasui et al. | |
| 2007/0201272 A1 | 8/2007 | Okazaki et al. | |
| 2007/0262382 A1 * | 11/2007 | Ishii et al. | 257/350 |
| 2008/0090350 A1 * | 4/2008 | Yan et al. | 438/257 |
| 2008/0142876 A1 * | 6/2008 | Arigane et al. | 257/324 |
| 2008/0290401 A1 * | 11/2008 | Yasui et al. | 257/324 |
| 2009/0078985 A1 | 3/2009 | Shukuri | |

(Continued)

FOREIGN PATENT DOCUMENTS

JP 9-252098 A 9/1997
(Continued)

OTHER PUBLICATIONS

International Search Report mailed Jan. 26, 2010, in International Application No. PCT/JP2009/068275.

(Continued)

*Primary Examiner* — Fernando L Toledo
*Assistant Examiner* — Peter Bradford
(74) *Attorney, Agent, or Firm* — Miles and Stockbridge P.C.

(57) ABSTRACT

To provide a technique capable of improving reliability of a semiconductor device having a nonvolatile memory cell by suppressing the reduction of the drive force.
A memory cell is configured by a selection pMIS having a selection gate electrode including a conductive film exhibiting a p-type conductivity and a memory pMIS having a memory gate electrode including a conductive film exhibiting a p-type conductivity, and at the time of write, hot electrons are injected into a charge storage layer from the side of a semiconductor substrate 1 and at the time of erase, hot holes are injected into the charge storage layer from the memory gate electrode.

18 Claims, 30 Drawing Sheets

U.S. PATENT DOCUMENTS

| | | | |
|---|---|---|---|
| 2009/0108378 A1* | 4/2009 | Zhu et al. | 257/412 |
| 2009/0122609 A1 | 5/2009 | Okazaki et al. | |
| 2009/0179277 A1* | 7/2009 | Nishimura | 257/369 |
| 2009/0206410 A1* | 8/2009 | Mitani | 257/368 |
| 2009/0233431 A1 | 9/2009 | Shukuri | |
| 2010/0038700 A1 | 2/2010 | Okazaki et al. | |
| 2010/0320524 A1 | 12/2010 | Shukuri | |
| 2011/0272753 A1* | 11/2011 | Funayama et al. | 257/299 |

FOREIGN PATENT DOCUMENTS

| | | |
|---|---|---|
| JP | 2002-353346 A | 12/2002 |
| JP | 2003-045981 A | 2/2003 |
| JP | 2003-309193 A | 10/2003 |
| JP | 2004-235519 A | 8/2004 |
| JP | 2004-247633 A | 9/2004 |
| JP | 2004-303918 A | 10/2004 |
| JP | 2004-303918 A | 10/2004 |
| JP | 2005-277430 A | 10/2005 |
| JP | 2005-294498 A | 10/2005 |
| JP | 2005-347679 A | 12/2005 |
| JP | 2006-049737 A | 2/2006 |
| JP | 2006-54292 A | 2/2006 |
| JP | 2007-189063 A | 7/2007 |
| JP | 2007-281092 A | 10/2007 |
| JP | 2007-311695 A | 11/2007 |
| JP | 2008-041832 A | 2/2008 |
| JP | 2008-270343 A | 11/2008 |
| JP | 2008-294088 A | 12/2008 |
| JP | 2008-294111 A | 12/2008 |
| JP | 2009-271966 A | 11/2009 |
| WO | WO-02-43151 A1 | 5/2002 |
| WO | WO02/43151 A1 | 5/2002 |

OTHER PUBLICATIONS

Written Opinion of the ISR mailed Jan. 26, 2010, in International Application No. PCT/JP2009/068275.

* cited by examiner

|  | Vmg (V) | Vcg (V) | Vd (V) | Vs (V) | Vsub (V) |
|---|---|---|---|---|---|
| WRITE (ELECTRON INJECTION) | 6 | 0 | open | -6 | 0 |
| ERASE (HOLE INJECTION) | 10 | 0 | 0 | 0 | 0 |
| READ | 0 | -1.5 | -1 | 0 | 0 |

SEMICONDUCTOR DEVICE HAVING A NONVOLATILE MEMORY CELL WITH A CAP INSULATING FILM FORMED OVER A SELECTION GATE ELECTRODE

CROSS-REFERENCE TO RELATED APPLICATION

The disclosure of Japanese Patent Application No. 2009-27604 filed on Feb. 9, 2009 including the specification, drawings and abstract is incorporated herein by reference in its entirety.

BACKGROUND OF THE INVENTION

The present invention relates to a semiconductor device and its manufacturing technique, in particular, to technology which is effective when applied to a semiconductor device having a MONOS (Metal Oxide Nitride Oxide Semiconductor) type nonvolatile memory cell and its manufacturing.

For example, in the twelfth embodiment of Japanese Patent Laid-Open No. 2004-303918 (Patent Document 1), a non-volatile memory cell is disclosed, in which the erase speed is increased by constituting a memory gate electrode by a two-layer conductive layer and making the concentration of n-type impurity in the lower conductive layer lower than the concentration of n-type impurity in the upper conductive layer, and then erasing data by utilizing both the effect of the pulling-out of electrons in a charge storage layer and the effect of recombination of the electrons contributing to data storage with holes injected from the memory gate electrode side. From a similar idea, a technique is also disclosed, which forms a memory gate electrode by using a polycrystal silicon film having p-type impurities.

In International Patent Publication No. WO 02/043151 Pamphlet (Patent Document 2), a technique is disclosed, which causes tensile stress to occur in a channel formation region of an n-channel MISFET and causes compression stress to occur in a channel formation region of a p-channel MISFET by using a self-alignment silicon nitride film.

SUMMARY OF THE INVENTION

As a nonvolatile memory capable of being electrically rewritten, an EEPROM (Electrically Erasable Programmable Read Only Memory) that uses a floating electrode made of polycrystal silicon is used mainly. However, with an EEPROM having such a structure, there may be a case where all charges stored in a storage node leak out owing to abnormal leakage if there occurs a defect in some part of an oxide film that surrounds the floating gate electrode because the charge storage layer is a conductor. It is considered that this problem will become more remarkable when, in particular, the miniaturization advances and the degree of integration is improved in the future.

Because of the above, a MONOS type nonvolatile memory cell which uses a nitride film as a charge storage layer attracts attention recently. In this case, it is possible to improve the reliability of data retention because charges contributing to data storage are stored in discrete traps of a nitride film, which is an insulator, and therefore, it is unlikely that all charges in the charge storage layer leak out even if an abnormal leak occurs owing to the occurrence of a defect in some part of an oxide film surrounding the storage node.

As a MONOS type nonvolatile memory cell, a memory cell with a single transistor structure is proposed. Further, a memory cell with a split gate structure of two-transistor configuration in which a selection gate electrode is provided is also proposed.

However, the MONOS type nonvolatile memory cell has various technical problems as described below.

In a conventional nonvolatile memory cell, an n-type memory cell is used and the injection by the SSI (Source Side Injection) method is employed for the write operation and the injection by the BTBT (Band to Band Tunneling) method is employed for the erase operation. However, as will be described below, while the injection by the BTBT method has an advantage that the erase operation can be performed at high speed, it has a possibility that deterioration of the reliability of the memory cell may be brought about.

By using FIG. 31 in which part of the section of essential parts of a nonvolatile memory cell is enlarged, the mechanism of deterioration of an ONO film (a laminated film including an oxide film, a nitride film, and an oxide film) by the injection by the BTBT method at the time of data erase is explained. In the figure, "-" represents a charge trap site, "x" represents a boundary surface level, and "h" represents a hot hole. By the injection by the SSI method, hot electrons are injected from the side of a substrate 51 into a charge storage layer (nitride film) CL and data is written to the nonvolatile memory cell.

For example, a voltage of −6 V is applied to a gate electrode G of the memory cell and a voltage of +6 V is applied to a source region S, and by the injection by the BTBT method, hot holes are injected from the source region S into a laminated film including an oxide film $52t$ in the upper layer/the charge storage layer (nitride film) CL/an oxide film $52b$ in the lower layer (hereinafter, referred to as an ONO film). Because of this, the electron already injected into the charge storage layer (nitride film) CL combine with the holes newly injected and thus, the data in the nonvolatile memory cell is erased.

It is possible to realize a high-speed erase operation by using hot holes. However, in the erase operation, holes given high energy are injected into the ONO film, and therefore, there arise a problem that a charge trap site is formed in the oxide film $52b$ in the lower layer, or that a boundary surface level is produced in the boundary surface between the oxide film $52b$ in the lower layer and the substrate 51, etc. The charge trap site or the boundary surface level described above will cause the reduction of the rewrite durability or data retention performance of a nonvolatile memory cell.

Because of the above, the inventors of the present invention have devised the application of a p-type memory cell that does not use the hot hole injection for the write operation and the erase operation to a nonvolatile memory cell. However, there was a problem that the drive force of the nonvolatile memory cell is reduced because the holes having a low mobility serve as carriers at the time of data read in the case of a p-type memory cell.

The present invention provides a technique capable of suppressing the reduction of the drive force and of improving reliability of a semiconductor device having a nonvolatile memory cell.

The above and other purposes and the new feature of the present invention will become clear from the description of the present specification and the accompanying drawings.

The following explains briefly an embodiment of a typical invention among the inventions disclosed in the present application.

This embodiment is a semiconductor device having a nonvolatile memory cell. The memory cell has a first gate insulating film exhibiting an n-type conductivity formed over a semiconductor substrate, a selection gate electrode including a first conductive film exhibiting a p-type conductivity formed over the first gate insulating film, a memory gate electrode including a second conductive film exhibiting a p-type conductivity formed into the form of a sidewall over one side surface of the selection gate electrode, a second gate insulating film formed between the selection gate electrode and the memory gate electrode and formed between the memory gate electrode and the semiconductor substrate, and a source region and a drain region including a semiconductor region exhibiting a p-type conductivity formed in a semiconductor substrate with a channel region sandwiched in between.

This embodiment is a semiconductor device having a nonvolatile memory cell. The memory cell has a first gate insulating film exhibiting an n-type conductivity formed over a semiconductor substrate, a selection gate electrode including a first conductive film exhibiting a p-type conductivity formed over the first gate insulating film, a cap insulating film having compression stress formed over the top surface of the selection gate electrode, a memory gate electrode including a second conductive film exhibiting a p-type conductivity formed into the form of a sidewall over one side surface of the selection gate electrode, a second gate insulating film formed between the selection gate electrode and the memory gate electrode and formed between the memory gate electrode and the semiconductor substrate, and a source region and a drain region including a semiconductor region exhibiting a p-type conductivity formed in a semiconductor substrate with a channel region sandwiched in between.

This embodiment is a method of manufacturing a semiconductor device that forms a nonvolatile memory cell over a semiconductor substrate. A step of forming a memory cell includes the steps of: (a) forming a first gate insulating film on the main surface of a semiconductor substrate; (b) forming a first conductive film exhibiting a p-type conductivity over the first gate insulating film; (c) forming a fifth insulating film over the first conductive film; (d) forming a selection gate electrode including the first conductive film and a cap insulating film including the fifth insulating film over the selection gate electrode by processing the fifth insulating film and the first conductive film; (e) after the step (d), forming a second gate insulating film over the semiconductor substrate; (f) forming a second conductive film exhibiting a p-type conductivity over the second gate insulating film; (g) forming a memory gate electrode into the form of a sidewall over the side surface of a laminated film including the cap insulating film and the selection gate electrode by performing anisotropic etching of the second conductive film; and (h) after the step (g), forming a first source region and a first drain region in the semiconductor substrate in a region where the memory cell is formed, and the cap insulating film has compression stress.

The following explains briefly the effect acquired by the typical embodiment among the inventions disclosed in the present application.

It is possible to improve reliability by suppressing the reduction of the drive force in a semiconductor device having a non-volatile memory cell.

DETAILED DESCRIPTION OF THE PREFERRED EMBODIMENTS

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In the following embodiments, a typical field effect transistor MISFET (Metal Insulator Semiconductor Field Effect Transistor) is abbreviated as MIS, a p-channel type MISFET as pMIS, and an n-channel type MISFET as nMIS. It is a matter of course that a MONOS type memory cell to be described in the following embodiments is included in a subordinate concept of MIS described above. Further, in the following embodiments, when silicon nitride is referred to, it should be noted that $Si_3N_4$ is included of course, but not limited thereto and an insulating film including nitride silicon and having a similar composition is also included. In the following embodiments, when a wafer is referred to, it should be noted that a Si (Silicon) single crystal wafer is referred to in most cases, but not limited thereto, and an insulating substrate or the like for forming an SOI (Silicon On Insulator) wafer and an integrated circuit thereon is also referred to. Its shape is not limited to a circle or substantially a circle, but a square, a rectangle and the like are also included.

In all the drawings for explaining the following embodiments, those which have the same functions are assigned the same symbols and their repeated explanation is omitted. The embodiments of the present invention are explained in detail based on the drawings.

(First Embodiment)

Figure 1:
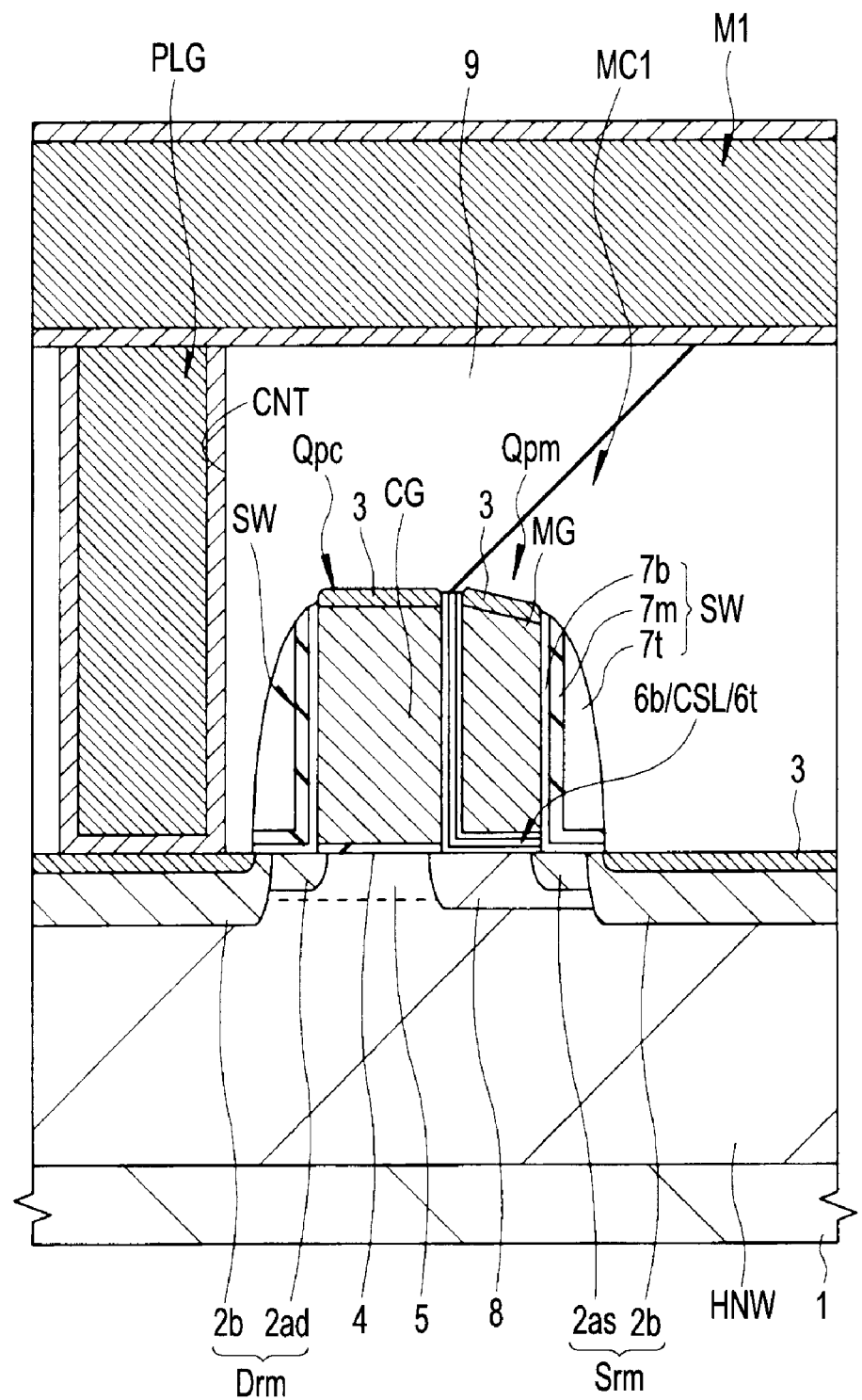
FIG. 1 is a section view of essential parts of a nonvolatile memory cell with a split gate structure (structure having a memory gate electrode in the form of a sidewall over one side surface of a selection pMIS selection gate electrode) according to a first embodiment of the present invention.

An example of a structure of a nonvolatile memory cell according to a first embodiment will be explained by using FIG. 1. FIG. 1 is a section view of essential parts of a nonvolatile memory cell obtained by cutting a channel along a direction that intersects a memory gate electrode, showing an example of a MONOS type nonvolatile memory cell with a split gate structure in which a memory gate electrode in the form of a sidewall is formed over one side surface of a selection pMIS selection gate electrode.

As shown in FIG. 1, a semiconductor substrate 1 includes, for example, p-type single crystal silicon and on the side of its main surface (device formation surface), an n-type well HNW is formed. Consequently, the semiconductor substrate 1 in the region where a memory cell MC1 is formed exhibits an n-type conductivity. Further, in the active region of the main surface of the semiconductor substrate 1, a selection pMIS (Qpc) and a memory pMIS (Qpm) of the memory cell MC1 are arranged. A drain region Drm of the memory cell MC1 has, for example, a $p^-$-type semiconductor region 2ad having a relatively low concentration and a $p^+$-type semiconductor region 2b having a relatively high concentration, the impurity concentration of which being higher than that of the $p^-$-type semiconductor region 2ad (Lightly Doped Drain (LDD) structure). A source region Srm of the memory cell MC1 has, for example, a $p^-$-type semiconductor region 2as having a relatively low concentration and the $p^+$-type semiconductor region 2b having a relatively high concentration, the impurity concentration of which being higher than that of the $p^-$-type semiconductor region 2as (LDD structure). The $p^-$-type semiconductor regions 2ad, 2as are arranged on the channel region side of the memory cell MC1 and the $p^+$-type semiconductor region 2b is arranged at a position the $p^-$-type semiconductor regions 2ad, 2as apart from the channel region side of the memory cell MC1.

Over the main surface of the semiconductor substrate 1 between the drain region Drm and the source region Srm, a selection gate electrode CG of the selection pMIS (Qpc) and a memory gate electrode MG of the memory pMIS (Qpm) are adjacent each other and extend, and in its extending direction, a plurality of the memory cells MC1 are adjacent each other via a shallow trench isolation (STI) part (not shown schematically) formed in the semiconductor substrate 1. The selection gate electrode CG is arranged in a first region of the main surface of the semiconductor substrate 1 and the memory gate electrode MG is arranged in a second region different from the first region of the main surface of the semiconductor substrate 1, and the memory gate electrode MG is formed into the form of a sidewall over one side surface of the selection gate electrode CG. The selection gate electrode CG includes a first conductive film, for example, p-type low-resistance polycrystal silicon and its impurity concentration is, for example, about $1 \times 10^{20}$ cm$^{-3}$, and its gate length is, for example, about 60 to 180 nm. The memory gate electrode MG includes a second conductive film, for example, p-type low-resistance polycrystal silicon, and its impurity concentration is, for example, about $1 \times 10^{20}$ cm$^{-3}$, and its gate length is, for example, about 40 to 100 nm. The height of the selection gate electrode CG from the main surface of the semiconductor substrate 1 is formed so as to be the same as the height of the selection gate electrode CG or lower than the height of the selection gate electrode CG, for example, about 200 nm. Here, if the height is formed so as to be lower than the height of the selection gate electrode CG, it is possible to reduce the possibility that a silicide layer 3 to be formed over the memory gate electrode MG and over the selection gate electrode CG may short-circuit.

On the top surface of the selection gate electrode CG and the memory gate electrode MG, respectively, for example, the silicide layer 3, such as nickel silicide (NiSi) and cobalt silicide (CoSi$_2$), is formed. The thickness of the silicide layer 3 is, for example, about 20 nm.

In a nonvolatile memory cell with a split gate structure, it is necessary to supply a potential to both the selection gate electrode CG and the memory gate electrode MG, and its operation speed largely depends on the resistance value of the selection gate electrode CG and the memory gate electrode MG. Because of this, it is desirable to make an attempt to reduce the resistance of the selection gate electrode CG and the memory gate electrode MG by forming the silicide layer 3. The silicide layer 3 is formed also on the top surface of the p$^+$-type semiconductor region 2b constituting part of the source region Srm and the drain region Drm.

Between the selection gate electrode CG and the main surface of the semiconductor substrate 1, a first gate insulating film 4 is provided. The first gate insulating film 4 includes, for example, silicon oxide, and its thickness is, for example, about 1 to 5 nm. Consequently, over the shallow trench isolation part and over the first region of the semiconductor substrate 1 via the first gate insulating film 4, the selection gate electrode CG is arranged. In the semiconductor substrate 1 under the first gate insulating film 4, a semiconductor region 5 is formed. The semiconductor region 5 is a semiconductor region for forming a channel of the selection pMIS (Qpc) and the semiconductor region 5 sets a threshold voltage of the selection pMIS (Qpc) to a predetermined value.

The memory gate electrode MG is provided over one side of the side surfaces of the selection gate electrode CG via a second gate insulating film. The second gate insulating film that insulates the selection gate electrode CG from the memory gate electrode MG includes a laminated film including an insulating film 6b in the lower layer, a charge storage layer CSL, and an insulating film 6t in the upper layer (hereinafter, referred to as the insulating films 6b, 6t and the charge storage layer CSL). Further, the memory gate electrode MG is arranged over the second region of the semiconductor substrate 1 via the insulating films 6b, 6t and the charge storage layer CSL. In FIG. 1, the insulating films 6b, 6t and the charge storage layer CSL are represented by 6b/CSL/6t.

The charge storage layer CSL includes, for example, silicon nitride and its thickness is, for example, about 5 to 20 nm. The charge storage layer CSL is an insulating film which has a discrete trap level in the film and has a function of storing charges in the trap level. The insulating films 6b, 6t include, for example, silicon oxide and the thickness of the insulating film 6b is, for example, about 1 to 10 nm and the thickness of the insulating film 6t is, for example, about 4 to 15 nm. It is also possible to form the insulating films 6b, 6t by silicon oxide including nitrogen. It may also be possible to constitute the charge storage layer CSL by a silicon oxide film in which silicon nano-crystal particles are dispersed. The silicon nano-crystal particle is a fine crystal silicon particle having a diameter of several nm.

On one side surface of the selection gate electrode CG (the side surface on the opposite side of the memory gate electrode MG, the side surface on the drain region Drm side) and on one side surface of the memory gate electrode MG (the side surface on the opposite side of the selection gate electrode CG, the side surface on the source region Srm side), a sidewall SW is formed, respectively. The sidewall SW includes a laminated film including, for example, a silicon oxide film 7b, a silicon nitride film 7m, and a silicon oxide film 7t. The thickness of the silicon oxide film 7b is, for example, about 20 nm, the thickness of the silicon nitride film 7m is, for example, about 25 nm, and the thickness of the silicon oxide film 7t is, for example, about 50 nm.

Under the insulating film 6b, a semiconductor region 8 is formed in the semiconductor substrate 1 between the semiconductor region 5 and the source region Srm. The semiconductor region 8 is a semiconductor region for forming a channel of the memory pMIS (Qpm) and the semiconductor region 8 sets the threshold voltage of the memory pMIS (Qpm) to a predetermined value.

The memory cell MC1 is covered with an interlayer insulating film 9 and in the interlayer insulating film 9, a contact hole CNT that reaches the drain region Drm is formed. To the drain region Drm, a first layer wire M1 that extends in a direction intersecting the memory gate electrode MG (or the selection gate electrode CG) via a plug PLG embedded within the contact hole CNT is coupled. Although the contact hole CNT that reaches the source region Srm is also formed as in the case of that which reaches the drain region Drm, only the contact hole CNT that reaches the drain region Drm is shown schematically for simplification of explanation in FIG. 1. The plug PLG includes a laminated film including, for example, a relatively thin barrier film including a laminated film of titanium and titanium nitride, and a relatively thick conductive film including tungsten or aluminum formed so as to be covered with the barrier film.

Next, a write method and an erase method of a MONOS type nonvolatile memory cell according to the first embodiment are explained by using FIG. 2 to FIG. 5.

Figures 2, 3:
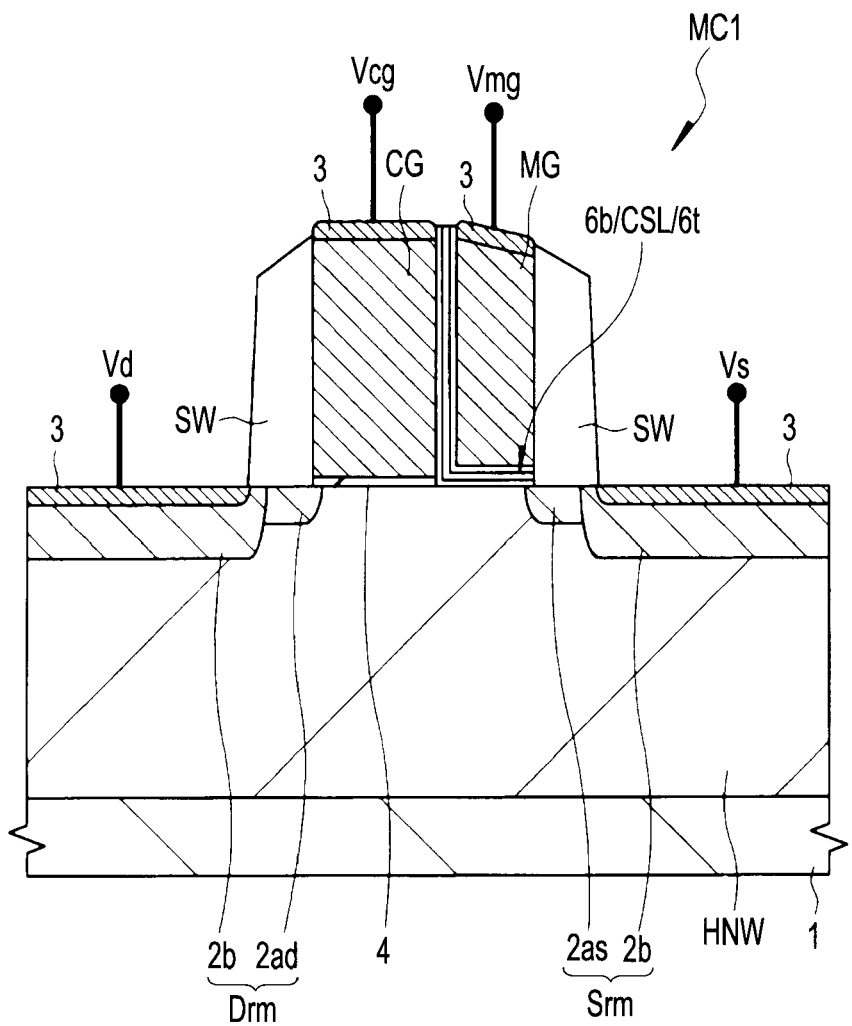
FIG. 2 is a section view of essential parts of a memory cell for explaining a voltage to be applied to each part of the memory cell at the time of write, erase, and read according to the first embodiment of the present invention.
FIG. 3 is an example of a voltage to be applied to each part of a memory cell at the time of write, erase, and read according to the first embodiment of the present invention.

FIG. 2 is a section view of essential parts of the memory cell MC1 for explaining a voltage to be applied to each part of the memory cell MC1 at the time of write, erase, and read. FIG. 3 is an example of a voltage to be applied to each part of the memory cell MC1 at the time of write, erase, and read.

Figure 4A:
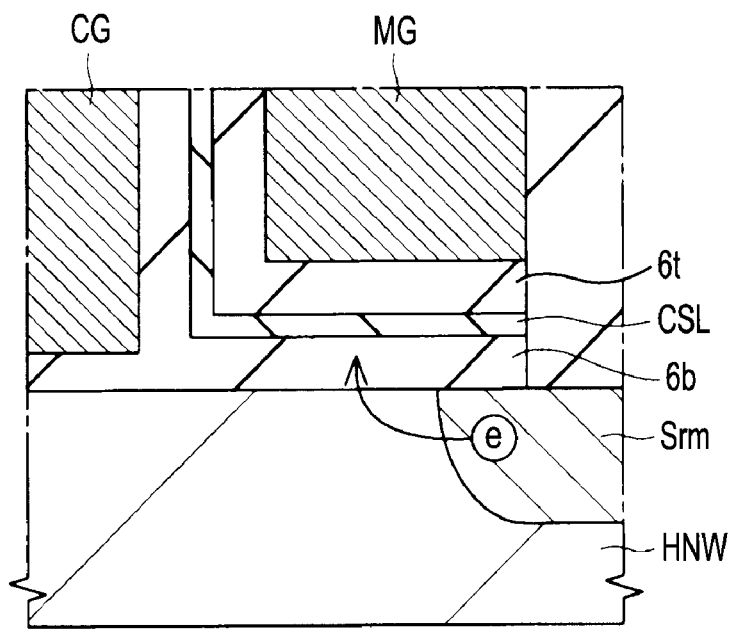
FIGS. 4(a) and (b) are an enlarged section view of essential parts of a memory cell for explaining a method of injecting electrons into the memory cell at the time of write, and a band structure diagram, respectively.
Figure 4B:
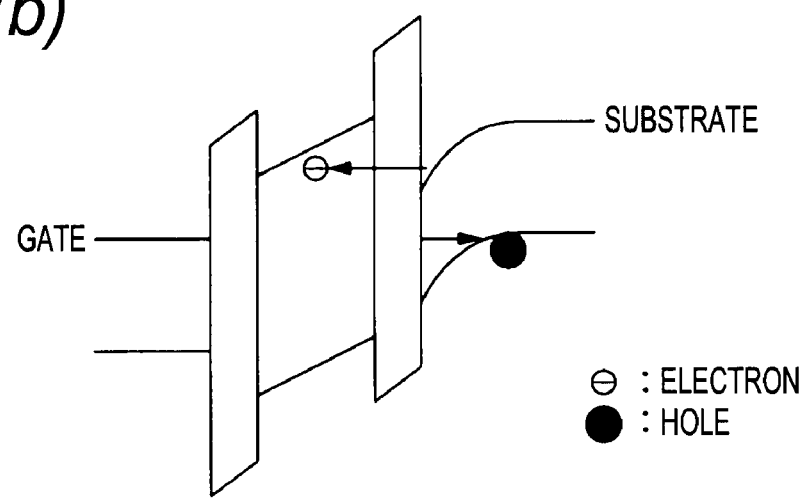
Figure 5A:
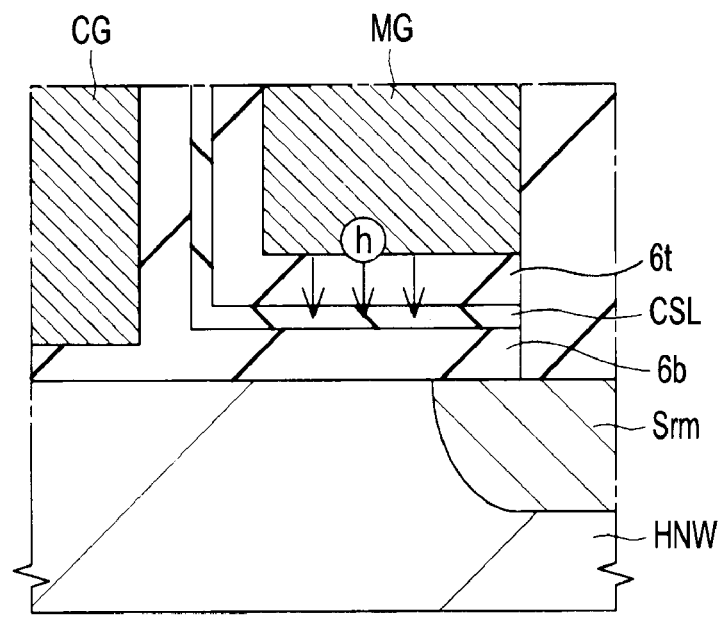
FIGS. 5(a) and (b) are an enlarged section view of essential parts of a memory cell for explaining a method of injecting holes into the memory cell at the time of erase, and a band structure diagram, respectively.
Figure 5B:
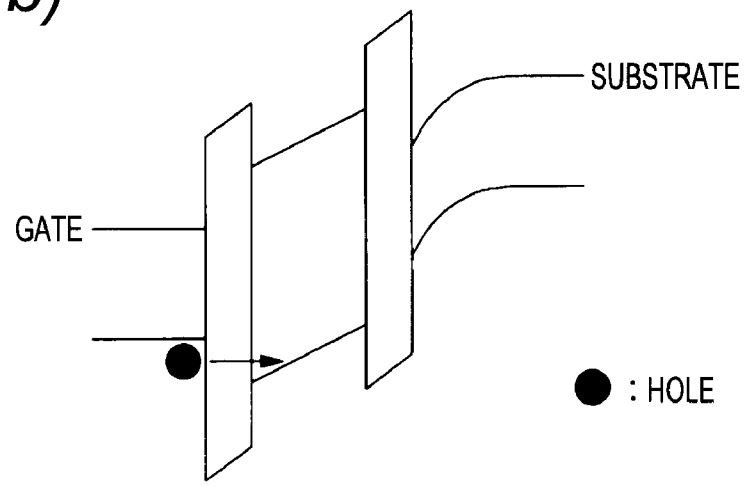

FIGS. 4(a) and (b) are an enlarged section view of essential parts of the memory cell MC1 for explaining a method of injecting electrons into the memory cell MC1 at the time of write, and a band structure diagram, respectively. FIGS. 5(a) and (b) are an enlarged section view of essential parts of the memory cell MC1 for explaining a method of injecting holes into the memory cell MC1 at the time of erase, and a band structure diagram, respectively. In FIG. 3, a voltage Vd to be applied to the drain region Drm of the memory cell MC1, a voltage Vcg to be applied to the selection gate electrode CG, a voltage Vmg to be applied to the memory gate electrode MG, a voltage Vs to be applied to the source region Srm, and a voltage Vsub to be applied to the semiconductor substrate 1 are described. The voltages shown in FIG. 3 are an example of application conditions and not limited to these but there can be various modifications in accordance with the need. In the first embodiment, the injection of electrons into the charge storage layer CSL is defined as "write" and the injection of holes as "erase".

The BTBT method by band-to-band tunnel is used to write data to the memory cell MC1, as shown in FIGS. 4(a) and (b). For example, each voltage shown in FIG. 3 is applied to each part of the memory cell MC1, and electrons generated in the source region Srm are accelerated in an electric field by the band-to-band tunnel phenomenon, and thus electrons are injected from the side of the semiconductor substrate 1 into the charge storage layer CSL. Electrons are injected locally into the charge storage layer CSL under the memory gate electrode MG. The injected electrons are captured discretely in the trap of the charge storage layer CSL and as a result, the threshold voltage of the memory pMIS (Qpm) is increased.

Here, the BTBT method is illustrated as a write method, however, it is also possible to use the SSI method. For example, each voltage is applied to each part of the memory cell MC1 and electrons generated in the channel region (between the source region Srm and the drain region Drm) under the two gate electrodes (the memory gate electrode MG and the selection gate electrode CG) are accelerated in an electric field. Electrons are injected locally into the region on the side of the selection pMIS (Qpc) of the charge storage layer CSL under the memory gate electrode MG. The injected electrons are captured discretely in the trap of the charge storage layer CSL and as a result, the threshold voltage of the memory pMIS (Qpm) is increased.

As shown in FIGS. 5(a) and (b), a Fowler-Nordheim (FN) tunnel current is used to erase data of the memory cell MC1. For example, in a state where each voltage shown in FIG. 3 is applied to each part of the memory cell MC1 and the energy band is inclined considerably by a strong electric field, holes are injected into the charge storage layer CSL. Holes are injected locally from the memory gate electrode MG into the charge storage layer CSL under the memory gate electrode MG by the tunnel effect. When the injected holes are captured discretely in the trap of the charge storage layer CSL, the threshold voltage of the memory pMIS (Qpm) is reduced.

At the time of read, for example, each voltage shown in FIG. 3 is applied to each part of the memory cell MC1 from which date is read. The voltage to be applied to the memory gate electrode MG at the time of read is set to a value between the threshold voltage of the memory pMIS (Qpm) in the write state and the threshold voltage of the memory pMIS (Qpm) in the erase state, and then, an electric current that flows through the drain region Drm is measured, and thereby, the write state and the erase state can be distinguished from each other by the magnitude of the current.

As described above, as the MONOS type nonvolatile memory cell with a split gate structure, a p-type memory cell including the selection pMIS (Qpc) and the memory pMIS (Qpm) is used. Further, at the time of write, the BTBT method or the SSI method in which electrons are injected from the side of the semiconductor substrate 1 into the charge storage layer CSL is employed, and at the time of erase, the FN tunnel current that injects holes from the side of the memory gate electrode MG into the charge storage layer CSL is used. Because of this, only electrons are injected from the side of the semiconductor substrate 1, and therefore, compared to the conventional n-type memory cell into which holes are injected from the side of the semiconductor substrate 1, the charge trap level becomes more unlikely to be generated in the insulating film 6b and the boundary level becomes more unlikely to be generated at the boundary surface between the insulating film 6b and the semiconductor substrate 1. Consequently, according to the first embodiment, it is possible to suppress the decrease in the rewrite durability or in the data retention performance of a nonvolatile memory cell. Further, by using electrons the mobility of which is higher than that of holes for the write operation, a high-speed operation becomes possible.

Figure 6:
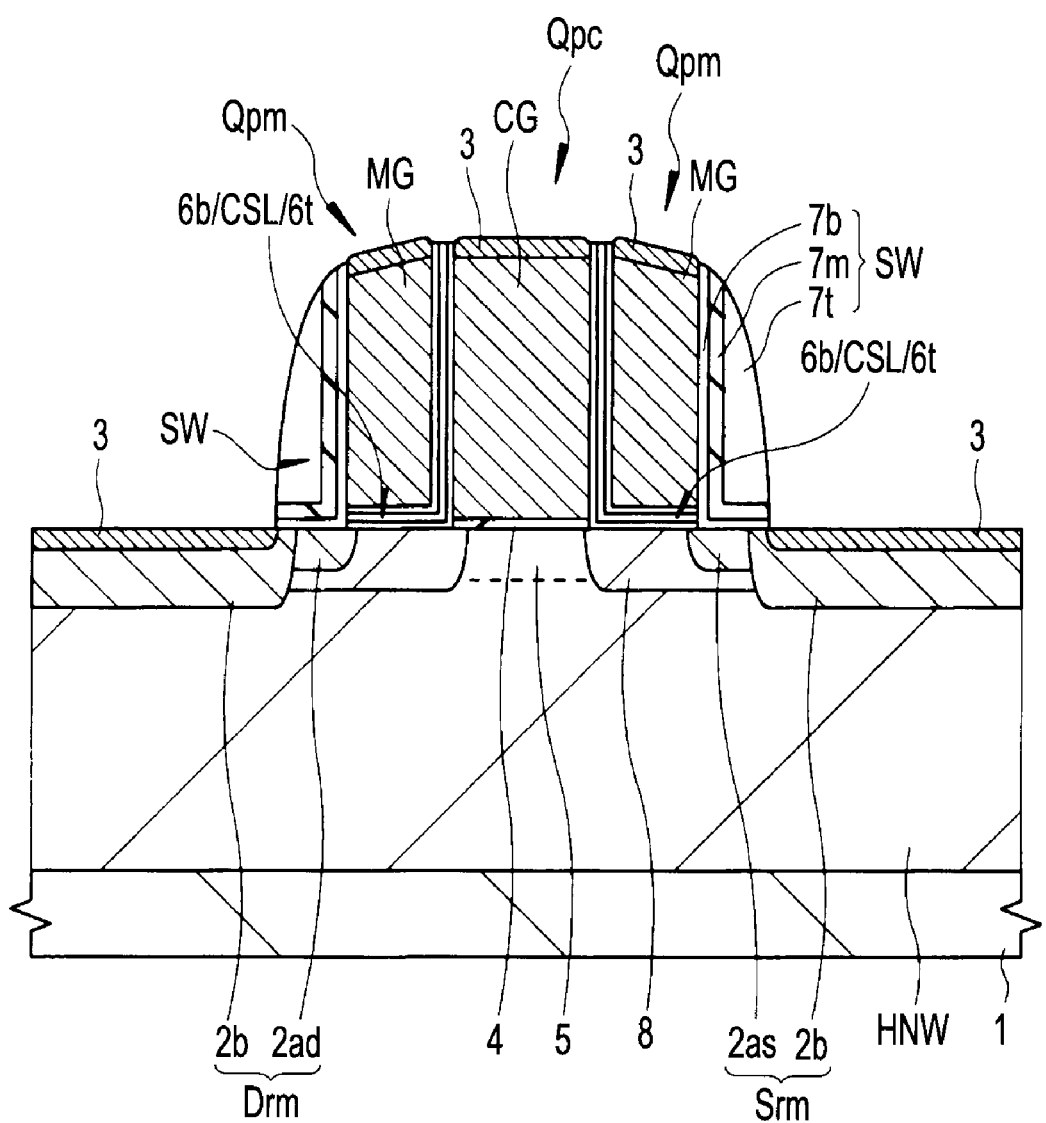
FIG. 6 is a section view of essential parts of a nonvolatile memory cell with a split gate structure (structure having a memory gate electrode in the form of a sidewall on both side surfaces of a selection pMIS selection gate electrode) according to the first embodiment of the present invention.

In the first embodiment, the MONOS type nonvolatile memory cell with a split gate structure is shown as an example, in which over one side surface of the selection gate electrode CG of the selection pMIS (Qpc), the memory gate electrode MG of the memory pMIS (Qpm) in the form of a sidewall is formed, however, this is not limited. For example, to a MONOS type nonvolatile memory cell with a split gate structure in which the memory gate electrode MG of the memory pMIS (Qpm) in the form of a sidewall is formed on both side surfaces of the selection gate electrode CG of the selection pMIS (Qpc) shown in FIG. 6, the invention of the subject application explained in the first embodiment can be applied.

Figure 7:
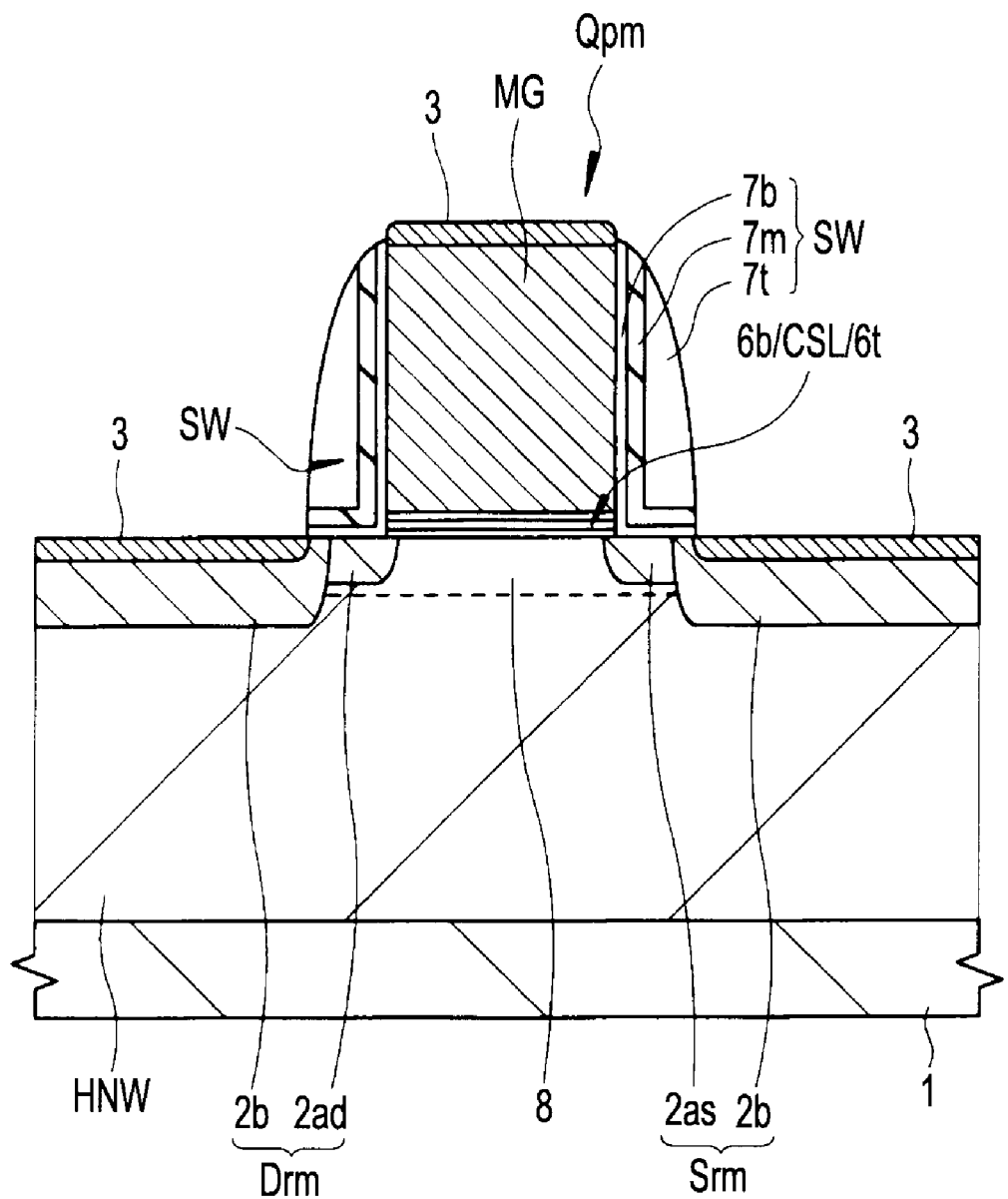
FIG. 7 is a section view of essential parts of a single structure nonvolatile memory cell according to the first embodiment of the present invention.

Further, the invention of the subject application explained in the first embodiment can also be applied to a MONOS type nonvolatile memory cell with a single structure shown in FIG. 7. An example of the structure of a MONOS type nonvolatile memory cell with a single structure is explained below by using FIG. 7.

In the active region on the main surface of the semiconductor substrate 1, the memory pMIS (Qpm) is arranged. The drain region Drm has, for example, the p$^-$-type semiconductor region 2ad having a relatively low concentration and the p$^+$-type semiconductor region 2b having a relatively high concentration, the impurity concentration of which is higher than that of the p$^-$-type semiconductor region 2ad (LDD structure), and the source region Srm has the p$^-$-type semiconductor region 2as having a relatively low concentration and the p$^+$-type semiconductor region 2b having a relatively high concentration, the impurity concentration of which is higher than that of the p$^-$-type semiconductor region 2as (LDD structure).

Over the main surface of the semiconductor substrate 1 between the drain region Drm and the source region Srm, the memory gate electrode MG of the memory pMIS (Qpm) is formed and the memory gate electrode MG includes a second conductive film, for example, p-type low-resistance polycrystal silicon, and its impurity concentration is, for example, about $1 \times 10^{20}$ cm$^{-3}$. Further, on the top surface of the p$^+$-type semiconductor region 2b constituting part of the source region Srm or the drain region Drm and on the top surface of the memory gate electrode MG, the silicide layer 3, such as, for example, nickel silicide or cobalt silicide, is formed.

Between the memory gate electrode MG and the main surface of the semiconductor substrate 1, the second gate insulating film is provided. The second gate insulating film includes the insulating films 6b, 6t and the charge storage layer CSL. In the semiconductor substrate 1 under the second gate insulating film, the semiconductor region 8 is formed. The semiconductor region 8 is one for forming a channel of the memory pMIS (Qpm) and the semiconductor region 8 sets the threshold voltage of the memory pMIS (Qpm) to a predetermined value.

On both side surfaces of the memory gate electrode MG, the sidewall SW is formed, respectively. The sidewall SW includes a laminated film including, for example, the silicon oxide film 7b, the silicon nitride film 7m, and the silicon oxide film 7t.

(Second Embodiment)

In a second embodiment, as in the first embodiment described above, a MONOS type nonvolatile memory cell with a split gate structure is used as a p-type memory cell including the selection pMIS (Qpc) and the memory pMIS (Qpm). A difference from the first embodiment described above lies in fact that a cap insulating film (CAP) is formed over the top surface of the selection gate electrode CG of the selection pMIS (Qpc). By the cap insulating film (CAP), it is possible to cause compression stress to occur in the channel region (between the source region Srm and the drain region Drm) under the selection gate electrode CG. The p-type memory cell uses holes the mobility of which is lower than that of electrons at the time of read, and therefore, there is a possibility that the operation speed may be reduced compared to the n-type memory cell. Because of this, the cap insulating film is formed over the top surface of the selection gate electrode CG and compression stress is applied to the channel region (between the source region Srm and the drain region Drm) under the selection gate electrode CG, and thus, the operation speed of the p-type memory cell is increased.

Here, stress in the invention of the subject application will be explained. Originally, as the background of the strained silicon technique, the main trend at first was to cause biaxial stress to occur in a channel region. The biaxial stress is stress that is caused to occur in the gate length direction and in the gate width direction. However, by the experiment conducted by the inventors of the present invention, it has been turned out that the drive current does not increase so much as expected when the biaxial stress is used. In particular, an increase in the drive current was small in the p-channel type MISFET. This was because the stress caused to occur in the gate length direction increased the drive current, however, the stress caused to occur in the gate width direction reduced the drive current. Thus, uniaxial stress which causes stress only in the gate length direction was required.

In the second embodiment, the stress caused to occur by the cap insulating film itself is biaxial stress. However, the cap insulating film is formed along the upper surface of the selection gate electrode CG, and therefore, strong stress is caused to occur in the direction from the sidewall on one side of the selection gate electrode CG toward the other sidewall. That is, it is common to extend the selection gate electrode CG so that the length in the gate width direction is greater in order to ensure an amount of electric current. It is also common to perform scaling so that the length in the gate length direction is smaller for a high-speed operation. Because of this, when the cap insulating film is formed over the selection gate electrode CG, it is possible to make by far greater the stress caused to occur in the gate length direction than the stress caused to occur in the gate width direction. That is, in the channel region under the selection gate electrode CG, stress is caused to occur mainly in the gate length direction.

In order to increase the drive current of a MISFET by using such stress, it is necessary for stress to be caused to occur in the entire channel region. That is, in an n-channel type MISFET, uniaxial tensile stress (stress to increase the distance between Si atoms) is applied to the entire channel region in the gate length direction. In a p-channel type MISFET, uniaxial compression stress (stress to reduce the distance between Si atoms) is applied to the entire channel region in the gate length direction. In the second embodiment, the value of stress to be applied to the channel region under the selection gate electrode CG is set to 1.0 GPa to 1.7 GPa. When this value is small, for example, about 100 MPa, the stress affects only the part in the vicinity of the end part of the selection gate electrode CG, and therefore, the drive current is not increased. Further, it is necessary to cause stress to occur in the entire channel region, and therefore, the effect is reduced if the gate length of the selection gate electrode CG is reduced. In the second embodiment, the gate length of the selection gate electrode CG is shown to be, for example, about 100 nm, however, it is assumed that a more significant effect can be obtained in the selection gate electrode CG having a gate length of 130 nm or less, by which stronger stress can be expected to be caused to occur, and further in the selection gate electrode CG having a gate length of 90 nm or less.

Figure 8:
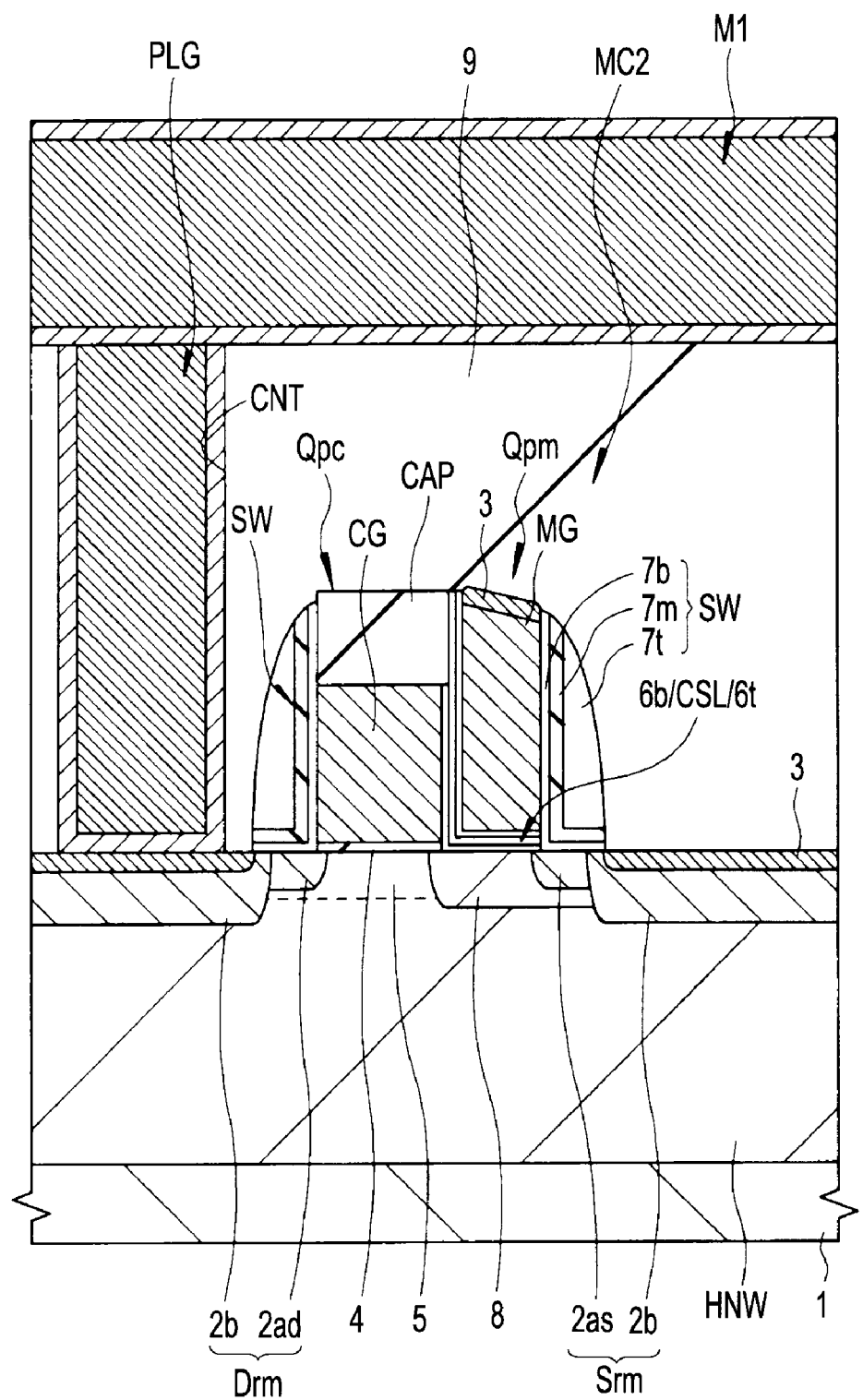
FIG. 8 is a section view of essential parts of a nonvolatile memory cell with a split gate structure (structure having a memory gate electrode in the form of a sidewall over one side surface of a selection pMIS selection gate electrode) according to a second embodiment of the present invention.

An example of a structure of a nonvolatile memory cell according to the second embodiment will be explained by using FIG. 8. FIG. 8 is a section view of essential parts of a nonvolatile memory cell when the channel is cut along a direction intersecting the memory gate electrode, showing an example of a MONOS type nonvolatile memory cell with a split gate structure in which a memory gate in the form of a sidewall is formed over one side surface of the selection gate electrode of the selection pMIS.

As shown in FIG. 8, a memory cell MC2 is the same as the memory cell MC1 explained in the first embodiment described above except that the cap insulating film CAP is formed over the top surface of the selection gate electrode CG of the selection pMIS (Qpc). Thus, the selection gate electrode CG of the selection pMIS (Qpc) and the memory gate electrode MG of the memory pMIS (Qpm) will be explained below.

Over the main surface of the semiconductor substrate 1 between the drain region Drm and the source region Srm, the selection gate electrode CG of the selection pMIS (Qpc) and the memory gate electrode MG of the memory pMIS (Qpm) are adjacent each other and extend, and a plurality of the memory cells MC2 is adjacent in its extending direction via a shallow trench isolation part formed on the semiconductor substrate 1. The selection gate electrode CG is arranged in a first region of the main surface of the semiconductor substrate 1, the memory gate electrode MG is arranged in a second region different from the first region of the main surface of the semiconductor substrate 1, and the memory gate electrode MG is formed into the form of a sidewall over one side surface of the selection gate electrode CG.

The selection gate electrode CG includes a first conductive film, for example, p-type low-resistance polycrystal silicon, and its impurity concentration is, for example, about $1 \times 10^{20}$ cm$^{-3}$ and its gate length is, for example, about 60 to 180 nm. The memory gate electrode MG includes a second conductive film, for example, p-type low-resistance polycrystal silicon, and its impurity concentration is, for example, about $1 \times 10^{20}$ cm$^{-3}$ and its gate length is, for example, about 40 to 100 nm. The height of the selection gate electrode CG from the main surface of the semiconductor substrate 1 is, for example, about 150 nm and the height of the memory gate electrode MG from the main surface of the semiconductor substrate 1 is, for example, about 200 nm.

Over the top surface of the selection gate electrode CG, the cap insulating film CAP that causes the above-described compression stress to occur is formed. The cap insulating film CAP includes, for example, silicon nitride, and its thickness is, for example, about 50 nm.

On the top surface of the memory gate electrode MG, the silicide layer 3, such as, for example, nickel silicide and cobalt silicide, is formed. The thickness of the silicide layer 3 is, for example, about 20 nm. In the second embodiment, the silicide layer 3 is formed only on the top surface of the memory gate electrode MG, but not formed on the top surface of the selection gate electrode CG. However, it is possible to obtain a desired operation speed by reducing the resistance of the first conductive film constituting the selection gate electrode CG. The silicide layer 3 is formed also on the top surface of the $n^+$-type semiconductor region 2b constituting the source region Srm or the drain region Drm.

Further, the interlayer insulating film 9 is formed over the memory cell MC2 and in the interlayer insulating film 9, the contact hole CNT that reaches the above-described silicide layer 3 and the plug PLG are formed. In FIG. 8, only the contact hole CNT that reaches the silicide layer 3 over the drain region Drm and the plug PLG are shown schematically for the sake of simplification of explanation.

On the other hand, it may also be possible to form the interlayer insulating film 9 in FIG. 8 by a laminated film the lower layer of which is, for example, a silicon nitride film and the upper layer of which is a silicon oxide film. At this time, it is also possible to form the silicon nitride film as an insulating film having compression stress or tensile stress like the cap insulating film CAP described above. Further, as will be described later, the silicon nitride film that is formed as the interlayer insulating film 9 can also be used as an etching stopper film when forming the contact hole CNT described above.

Next, a method of manufacturing a semiconductor device having a MONOS type nonvolatile memory cell with a split gate structure according to the second embodiment will be explained in order of steps by using FIG. 9 to FIG. 25. FIG. 9 to FIG. 25 are each a section view of essential parts of a memory region, electricity supply regions (MG shunt part and CG shunt part), a capacitor region, and peripheral circuit regions (low voltage system nMIS region, low voltage system pMIS region, high voltage system nMIS region, and high voltage system pMIS region) during a manufacturing process of a semiconductor device.

As in the first embodiment described above, circuits such as, for example, peripheral circuits (write circuit/read circuit/erase circuit) of a nonvolatile memory, a logic circuit, and a microprocessor such as CPU, are configured by MISFET formed in the peripheral circuit region. The MG shunt part indicates a region that supplies a potential to the memory gate electrode MG. The CG shunt part indicates a region that supplies a potential to the selection gate electrode CG.

Figure 9:
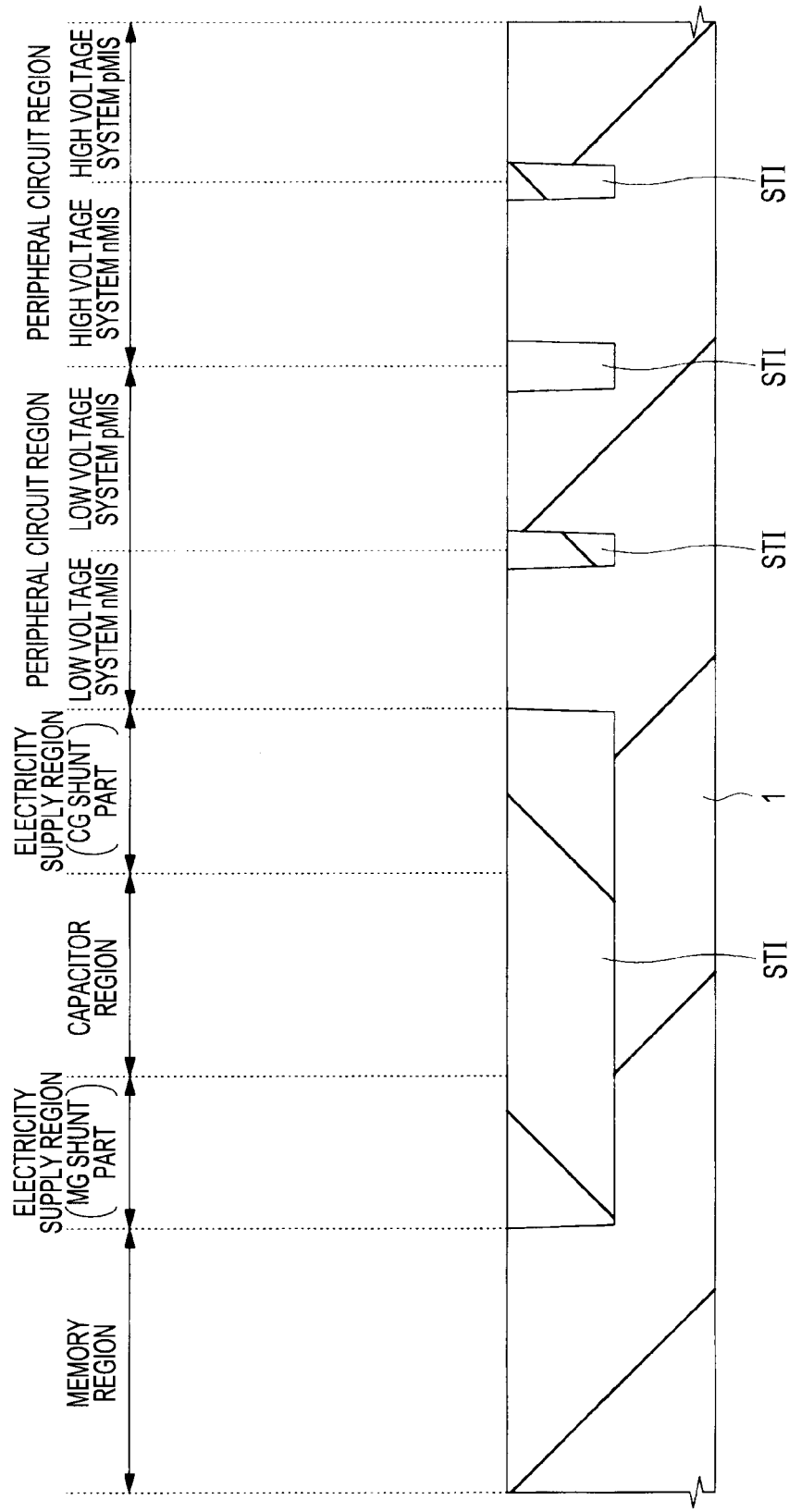
FIG. 9 is a section view of essential parts of a memory region, electricity supply regions (MG shunt part and CG shunt part), a capacitor region, and peripheral circuit regions (low voltage system nMIS region, low voltage system pMIS region, high voltage system nMIS region, and high voltage system pMIS region), showing a manufacturing process of a semiconductor device according to the second embodiment of the present invention.

First, as shown in FIG. 9, on the main surface of the semiconductor substrate (in this stage, a thin semiconductor plate in the shape of substantially a plane circle, referred to as a semiconductor wafer) 1, for example, the groove-type shallow trench isolation part STI, active regions arranged so as to be surrounded by the shallow trench isolation part, etc., are formed. That is, after forming a separation groove at a predetermined part of the semiconductor substrate 1, an insulating film including, for example, silicon oxide, is deposited on the main surface of the semiconductor substrate 1, and further, the insulating film is polished by the CMP (Chemical Mechanical Polishing) method etc. so that the insulating film is left only in the separation groove, and thus the shallow trench isolation part STI is formed. The shallow trench isolation part STI is formed also on the semiconductor substrate 1 in the electricity supply region and the capacitor region.

Figure 10:
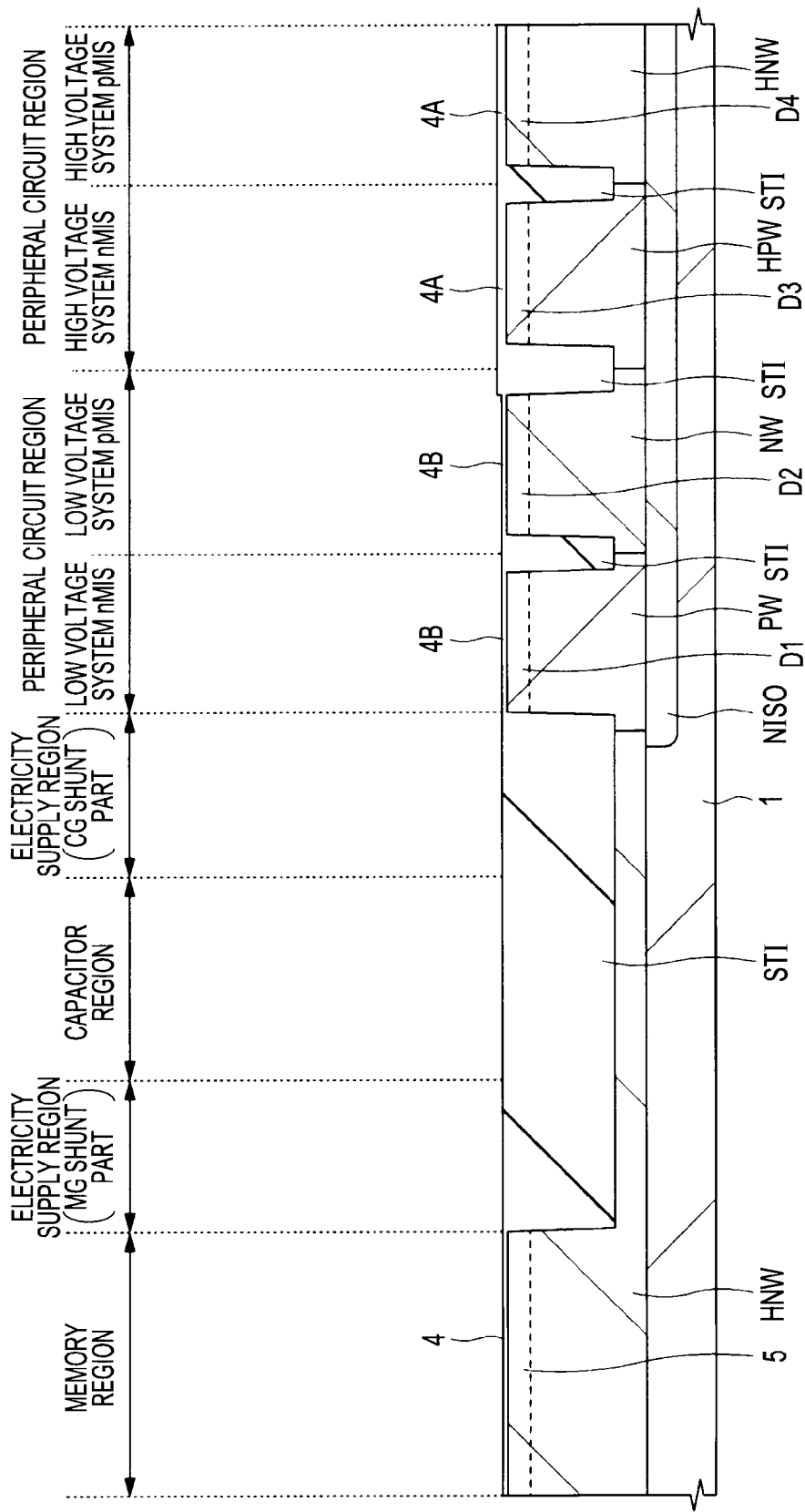
FIG. 10 is s section view of essential parts of the same portion as that in FIG. 9 during the manufacturing process of a semiconductor device, following FIG. 9.

Next, as shown in FIG. 10, an n-type embedded well NISO is formed by selectively ion-injecting impurities into the semiconductor substrate 1 in the peripheral circuit region. Subsequently, a p-type well HPW is formed by selectively ion-injecting impurities into the semiconductor substrate 1 in the high voltage system nMIS region and an n-type well HNW is formed by selectively ion-injecting impurities into the semiconductor substrate 1 in the memory region and in the high voltage system pMIS region. Similarly, a p-type well PW is formed by selectively ion-injecting impurities into the semiconductor substrate 1 in the low voltage system nMIS region, and an n-type well NW is formed by selectively ion-injecting impurities into the semiconductor substrate 1 in the low voltage system pMIS region.

Next, in the semiconductor substrate 1 in the memory region, the semiconductor region 5 for forming a channel of the selection pMIS (Qpc) is formed. Similarly, into the semiconductor substrate 1 in the low voltage system nMIS region, the low voltage system pMIS region, the high voltage system nMIS region, and the high voltage system pMIS region in the peripheral circuit region, predetermined impurities are ion-injected. Because of this, semiconductor regions D1, D2, D3, and D4 for forming a channel are formed in the semiconductor substrate 1 in the low voltage system nMIS region, the low voltage system pMIS region, the high voltage system nMIS region, and the high voltage system pMIS region in the peripheral circuit region, respectively.

Next, by performing oxidation processing of the semiconductor substrate 1, a fourth gate insulating film 4A including, for example, silicon oxide, and having a thickness of about 20 nm is formed over the main surface of the semiconductor substrate 1. Subsequently, after removing the fourth gate insulating film 4A in the memory region, the low voltage system nMIS region, and the low voltage system pMIS region, oxidation processing of the semiconductor substrate 1 is performed. Because of this, the first gate insulating film 4 including, for example, silicon oxide, and having a thickness of about 1 to 5 nm is formed over the main surface of the semiconductor substrate 1 in the memory region, and at the same time, over the main surface of the semiconductor substrate 1 in the low voltage system nMIS region and the low voltage system pMIS region, a third gate insulating film 4B including, for example, silicon oxide, and having a thickness of about 1 to 5 nm is formed. Here, although the first gate insulating film 4 and the third gate insulating film 4B are formed in the same oxidation processing step, they may be formed in different steps.

Figure 11:
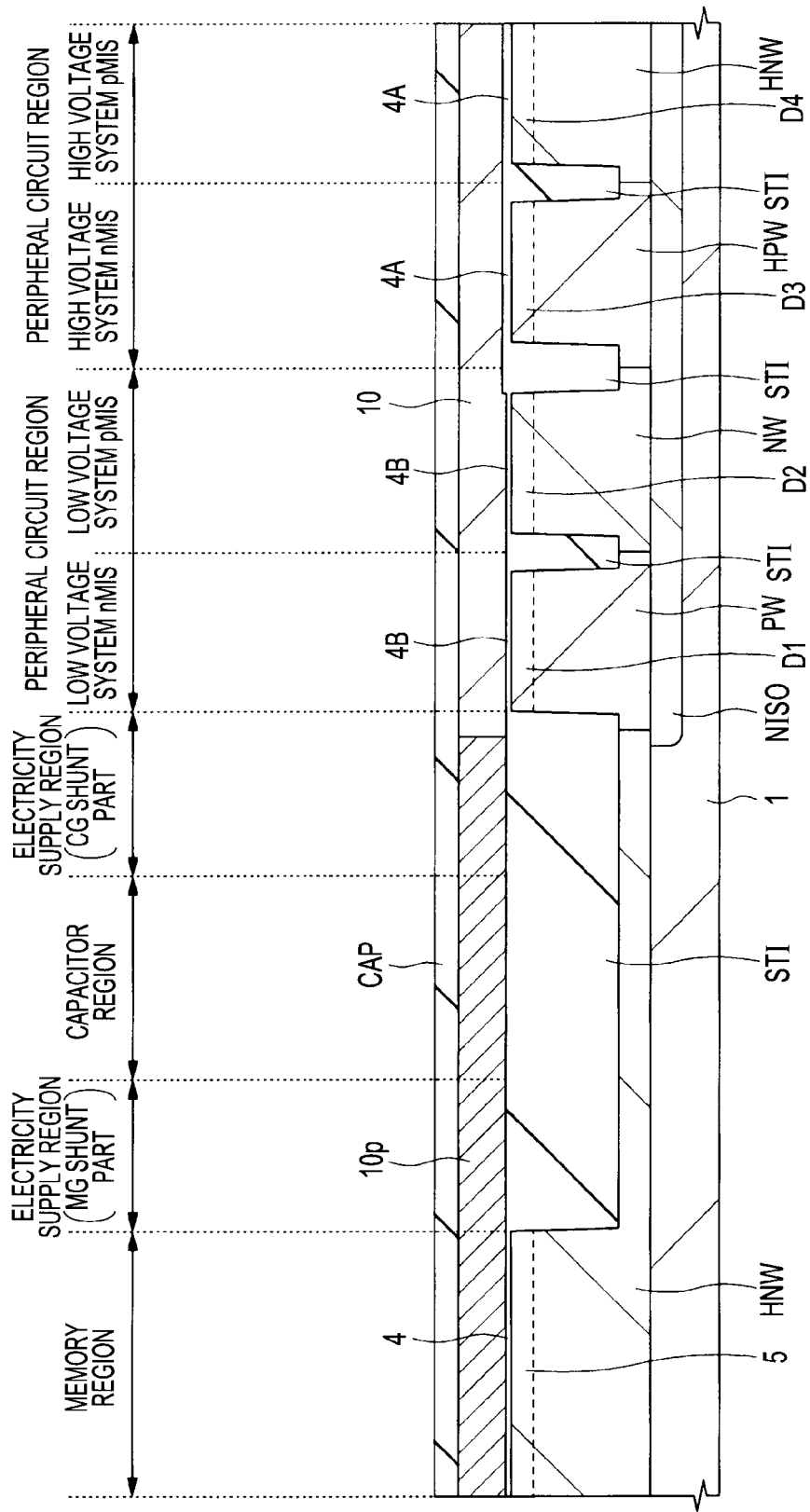
FIG. 11 is a section view of essential parts of the same portion as that in FIG. 9 during the manufacturing process of a semiconductor device, following FIG. 10.

Next, as shown in FIG. 11, after depositing a conductive film 10 including, for example, amorphous silicon, by the CVD (Chemical Vapor Deposition) method over the main surface of the semiconductor substrate 1, a p-type conductive film (first conductive film) 10p is formed by introducing impurities by the ion injection method into the conductive film 10 in the memory region, the electricity supply region, and the capacitor region. The thickness of the conductive films 10, 10p is, for example, about 150 nm. Subsequently, the cap insulating film CAP is deposited over the conductive films 10, 10p by the CVD method. The cap insulating film CAP is, for example, silicon nitride, silicon oxide, silicon oxide containing nitrogen, or silicon carbide containing nitrogen, and its thickness is, for example, about 50 to 100 nm.

Figure 12:
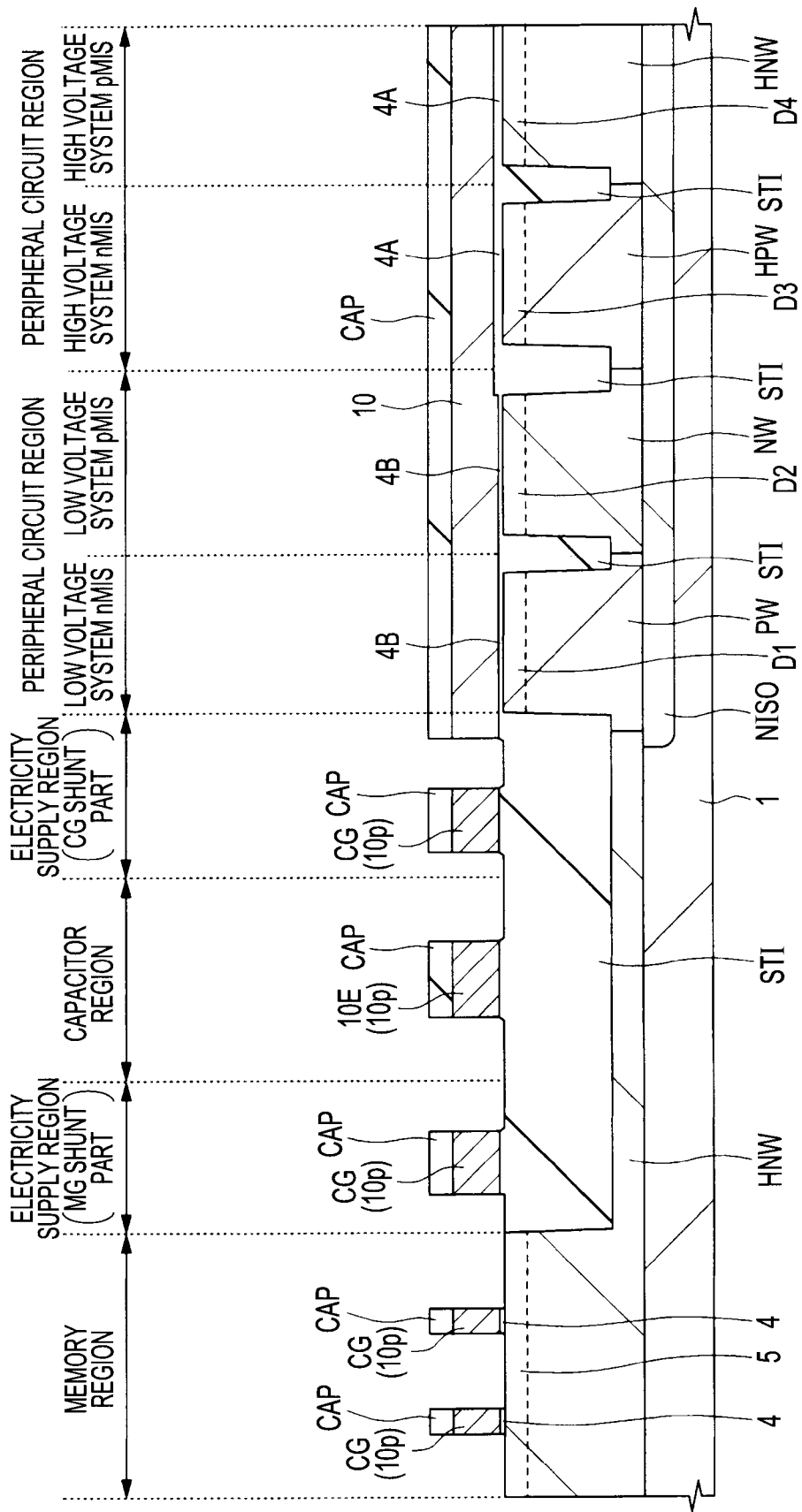
FIG. 12 is a section view of essential parts of the same portion as that in FIG. 9 during the manufacturing process of a semiconductor device, following FIG. 11.

Next, as shown in FIG. 12, the cap insulating film CAP and the p-type conductive film 10p in the memory region, the electricity supply region, and the capacitor region are patterned sequentially by the lithography technique and the dry etching technique. Because of this, in the memory region and the electricity supply region, the selection gate electrode CG of the selection pMIS (Qpc) including the p-type conductive film 10p and the cap insulating film CAP over the top part of the selection gate electrode CG are formed. When the cap insulating film CAP includes silicon nitride having compression stress, the compression stress is applied to the channel region (between the source region Srm and the drain region Drm) under the selection gate electrode CG and thereby it is possible to increase the operation speed of the p-type memory cell. The gate length of the selection gate electrode CG in the memory region is, for example, about 100 nm. At the same time, a lower electrode 10E including the p-type conductive film 10p is formed in the capacitor region.

Figure 13:
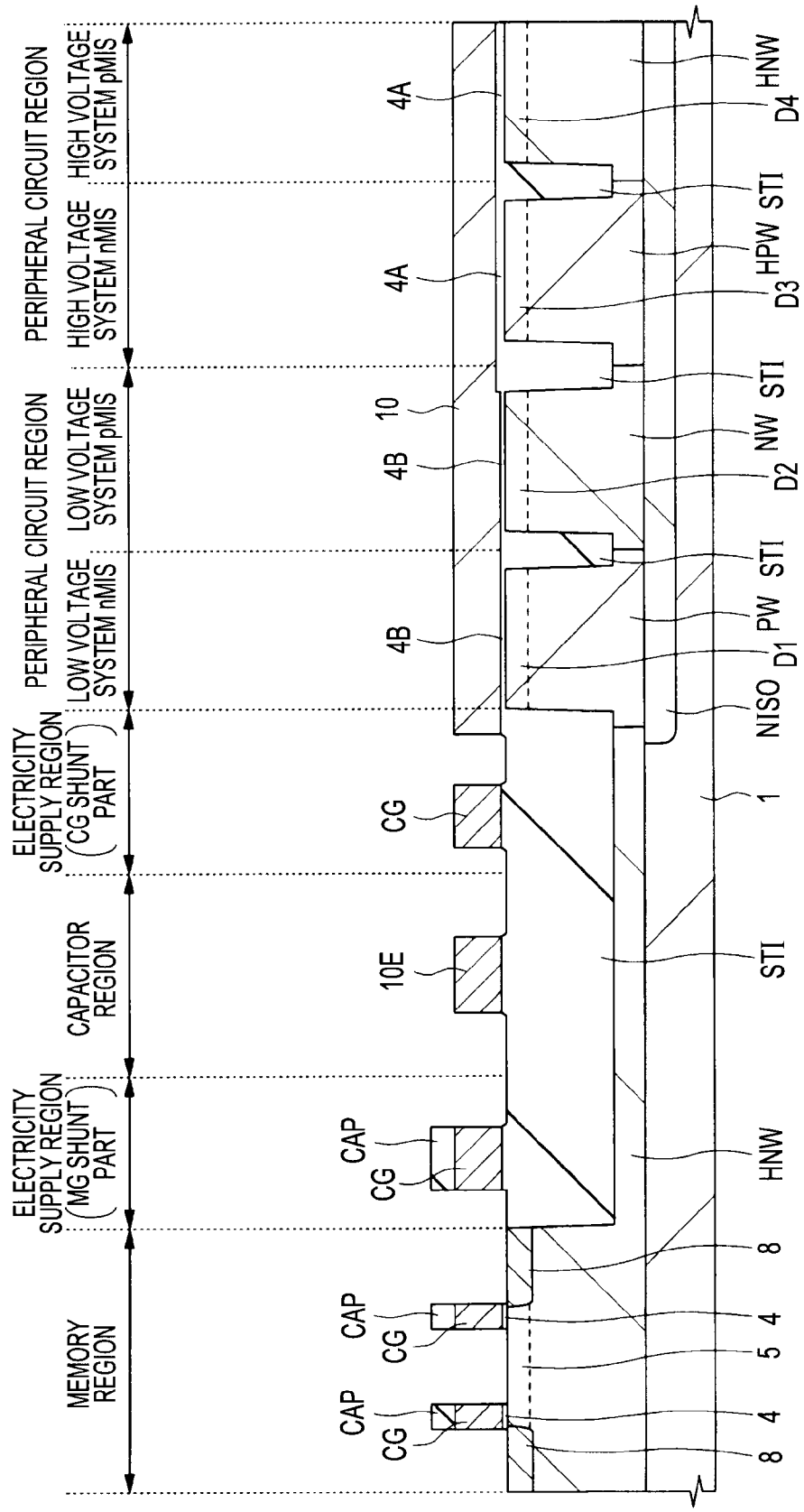
FIG. 13 is a section view of essential parts of the same portion as that in FIG. 9 during the manufacturing process of a semiconductor device, following FIG. 12.

Next, as shown in FIG. 13, the cap insulating film CAP in the CG shunt part in the electricity supply region, the capacitor region, and the peripheral circuit region are removed. In the CG shunt part in the electricity supply region and the peripheral circuit region, it is necessary to form the silicide layer 3 over the selection gate electrode CG and gate electrodes GLn, GLp, GHn, GHp in a later step. Because of this, it is necessary to remove the cap insulating film CAP in this step. Further, in the capacitor region, if the cap insulating film CAP is left, the dielectric film between an upper electrode 11E and the lower electrode 10E becomes too thick and the capacitance value is reduced. Consequently, it is necessary to remove the cap insulating film CAP in this step.

Next, the p-type semiconductor region 8 for forming a channel of the memory pMIS (Qpm) is formed over the main surface of the semiconductor substrate 1 in the memory region through the use of the cap insulating film CAP, the selection gate electrode CG of the selection pMIS (Qpc), and a resist pattern as a mask.

Figure 14:
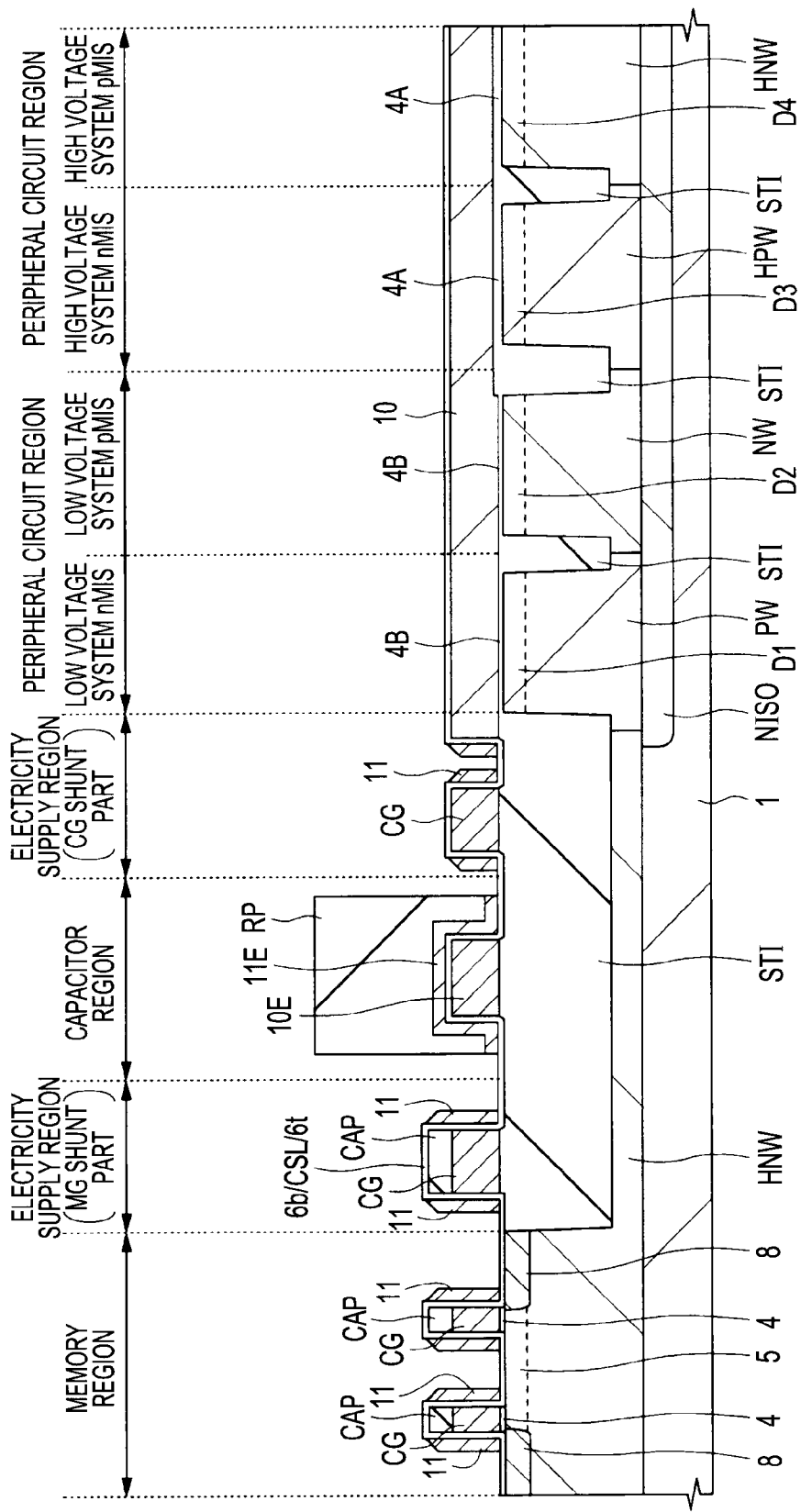
FIG. 14 is a section view of essential parts of the same portion as that in FIG. 9 during the manufacturing process of a semiconductor device, following FIG. 13.

Next, as shown in FIG. 14, over the main surface of the semiconductor substrate 1, for example, the lower layer insulating film 6b including silicon oxide, the charge storage layer CSL including silicon nitride, and the upper layer insulating film 6t including silicon oxide are formed sequentially. The insulating film 6b is formed by, for example, the thermal oxidation method or the ISSG oxidation method, and its thickness is, for example, about 1 to 10 nm, the charge storage layer CSL is formed by the CVD method and its thickness is, for example, about 5 to 20 nm, and the insulating film 6t is formed by, for example, the CVD method or the ISSG oxidation method, and its thickness is, for example, 4 to 15 nm as shown illustratively. The insulating films 6b, 6t may be formed by silicon oxide containing nitrogen.

Next, over the main surface of the semiconductor substrate 1, a conductive film (second conductive film) for forming a memory gate including low-resistance polycrystal silicon is deposited. The conductive film is formed by the CVD method and its thickness is, for example, about 40 to 100 nm. Subsequently, the conductive film is etched back by the anisotropic dry etching method through the use of the lithography technique and the dry etching technique. Because of this, in the memory region and the MG shunt part in the electricity supply region, a sidewall 11 is formed via the insulating films 6b, 6t and the charge storage layer CSL on both side surfaces of a laminated film including the cap insulating film CAP and the selection gate electrode CG of the selection pMIS (Qpc). At the same time, in the CG shunt part in the electricity supply region, the sidewall 11 is formed via the insulating films 6b, 6t and the charge storage layer CSL on both side surfaces of the selection gate electrode CG of the selection pMIS (Qpc). Further, in the capacitor region, the upper electrode 11E is formed so as to cover the lower electrode 10E by using a resist pattern RP as a mask.

Figure 15:
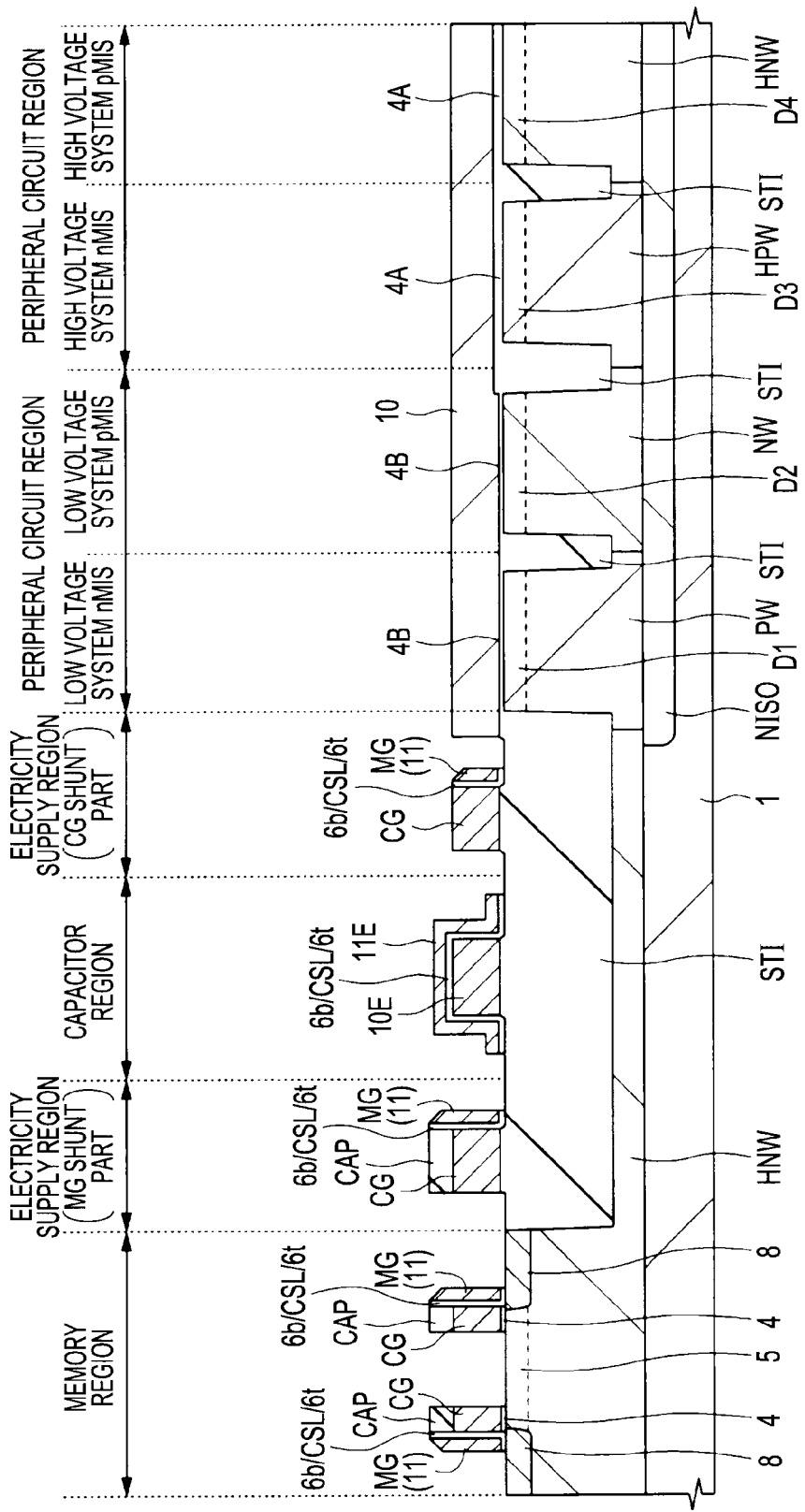
FIG. 15 is a section view of essential parts of the same portion as that in FIG. 9 during the manufacturing process of a semiconductor device, following FIG. 14.

Next, as shown in FIG. 15, by using a resist pattern as a mask, the sidewall 11 that is exposed therefrom is etched. Because of this, in the memory region and the MG shunt region in the electricity supply region, the memory gate electrode MG (sidewall 11) of the memory pMIS (Qpm) is formed only over one side surface of the laminated film including the cap insulating film CAP and the selection gate electrode CG of the selection pMIS (Qpc). The gate length of the memory gate electrode MG is, for example, about 65 nm. At the same time, in the CG shunt part in the electricity supply region, the memory gate electrode MG (sidewall 11) of the memory pMIS (Qpm) is formed only over one side surface of the selection gate electrode CG of the selection pMIS (Qpc).

Next, in the memory region, the insulating films 6b, 6t and the charge storage layer CSL between the laminated film including the cap insulating film CAP and the selection gate electrode CG and the memory gate electrode MG, and between the semiconductor substrate 1 and the memory gate electrode MG are left, and in the MG shunt part in the electricity supply region, the insulating films 6b, 6t and the charge storage layer CSL between the laminated film including the cap insulating film CAP and the selection gate electrode CG and the memory gate electrode MG, and between the shallow trench isolation part STI and the memory gate electrode MG are left, and in the CG shunt part in the electricity supply region, the insulating films 6b, 6t and the charge storage layer CSL between the selection gate electrode CG and the memory gate electrode MG, and between the shallow trench isolation part STI and the memory gate electrode MG are left, and in the capacitor region, the insulating films 6b, 6t and the charge storage layer CSL between the lower electrode 10E and the upper electrode 11E, and between the shallow trench isolation part STI and the upper electrode 11E are left, and then the insulating films 6b, 6t and the charge storage layer CSL in other regions are etched selectively.

In the memory region, the sidewall 11 is formed via the insulating films 6b, 6t and the charge storage layer CSL on the side surface of the laminated film including the cap insulating film CAP and the selection gate electrode CG, and therefore, the height of the memory gate electrode MG from the main surface of the semiconductor substrate 1 is formed so as to be greater than the height of the selection gate electrode CG from the main surface of the semiconductor substrate 1 and to be equal to or less than the height of the cap insulating film CAP. Further, the insulating films 6b, 6t and the charge storage layer CSL (second gate insulating film) are formed between the laminated film including the cap insulating film CAP and the selection gate electrode CG and the memory gate electrode MG, and therefore, the height of the insulating films 6b, 6t and the charge storage layer CSL (second gate insulating film) is formed so as to be greater than the height of the selection gate electrode CG from the main surface of the semiconductor substrate 1.

Similarly, in the MG shunt part in the electricity supply region also, the sidewall 11 is formed via the insulating films 6b, 6t and the charge storage layer CSL on the side surface of the laminated film including the cap insulating film CAP and the selection gate electrode CG, and therefore, the height of the memory gate electrode MG from the main surface of the semiconductor substrate 1 is formed so as to be greater than the height of the selection gate electrode CG from the main surface of the semiconductor substrate 1 and to be equal to or less than the height of the cap insulating film CAP. Further, the insulating films 6b, 6t and the charge storage layer CSL (second gate insulating film) are formed between the laminated film including the cap insulating film CAP and the selection gate electrode CG, and the memory gate electrode MG, and therefore, the height of the insulating films 6b, 6t and the charge storage layer CSL (second gate insulating film) is formed so as to be greater than the height of the selection gate electrode CG from the main surface of the semiconductor substrate 1.

However, in the CG shunt part in the electricity supply region, the sidewall 11 is formed via the insulating films 6b, 6t and the charge storage layer CSL on one side surface of the selection gate electrode CG, and therefore, the height of the memory gate electrode MG from the main surface of the semiconductor substrate 1 and the height of the selection gate electrode CG from the main surface of the semiconductor substrate 1 are formed so as to be the same, or the height of the memory gate electrode MG is formed so as to be less than the height of the selection gate electrode CG. Further, the height of the memory gate electrode MG in the CG shunt part in the electricity supply region is formed so as to be less than the height of the memory gate electrode MG in the memory region from the main surface of the semiconductor substrate 1.

In the capacitor region, a capacitor is formed, which includes the lower electrode 10E including a conductive film in the same layer as the selection gate electrode CG of the selection pMIS (Qpc) and the upper electrode 11E including a conductive film in the same layer as the memory gate electrode MG of the memory pMIS (Qpm), by using the insulating films 6b, 6t and the charge storage layer CSL as a capacitor insulating film (dielectric film). The capacitor constitutes, for example, a charge pump circuit used in a power supply circuit that outputs, for example, a voltage higher than an input voltage. It is possible for the charge pump circuit to increase the voltage by switching the coupling states of a plurality of capacitors through the use of a switch etc.

The lower electrode 10E and the upper electrode 11E are formed by a p-type conductive film as described above, and therefore, the reliability of the capacitor is improved.

Figure 16:
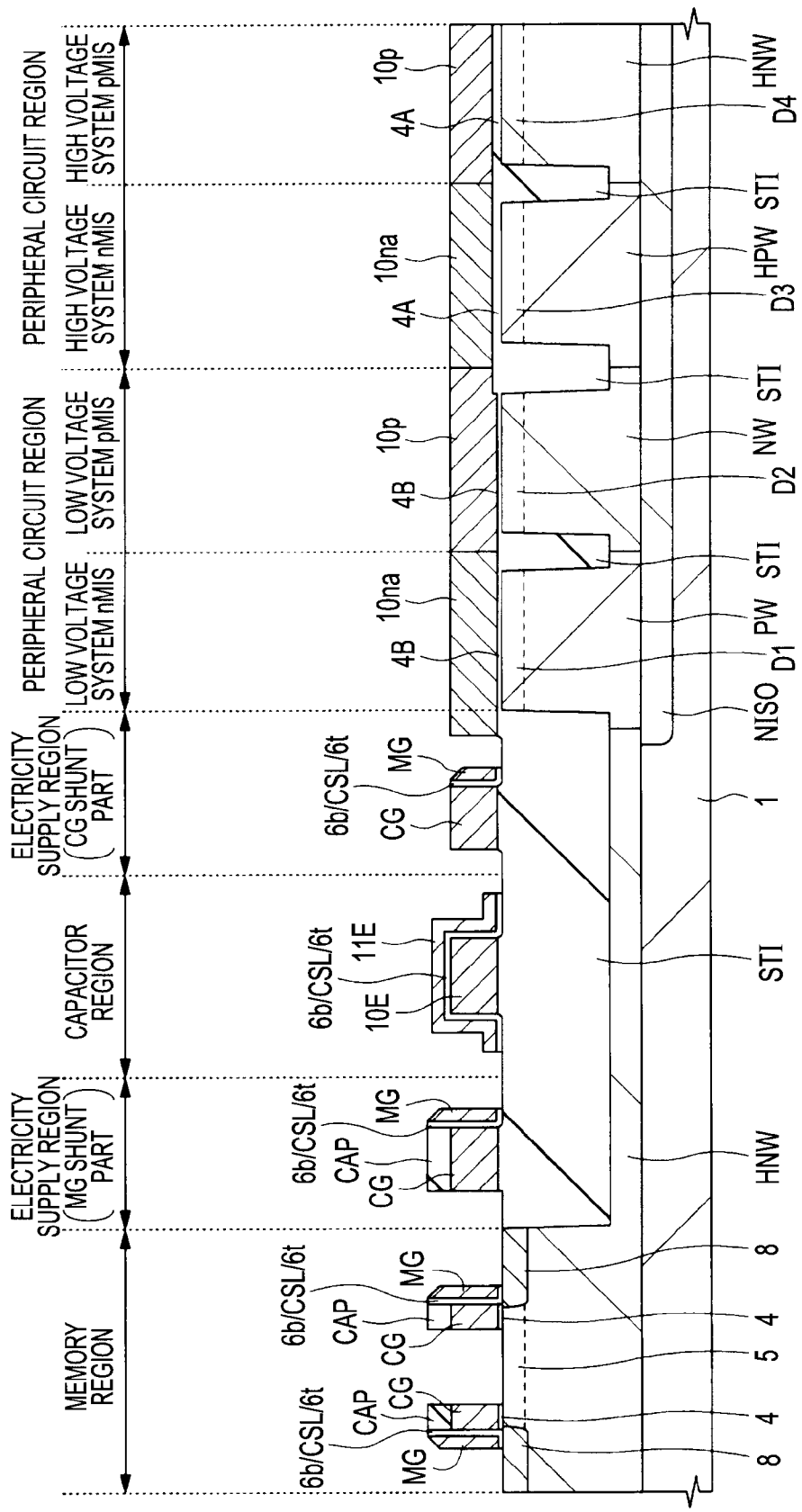
FIG. 16 is a section view of essential parts of the same portion as that in FIG. 9 during the manufacturing process of a semiconductor device, following FIG. 15.

Next, as shown in FIG. 16, by introducing impurities by the ion injection method etc. into the conductive film 10 in the low voltage system nMIS region and the high voltage system nMIS region in the peripheral circuit region, an n-type conductive film 10na is formed. Further, by introducing impurities by the ion injection method etc. into the conductive film 10 in the low voltage system pMIS region and the high voltage system pMIS region in the peripheral circuit region, a p-type conductive film 10p is formed.

Figure 17:
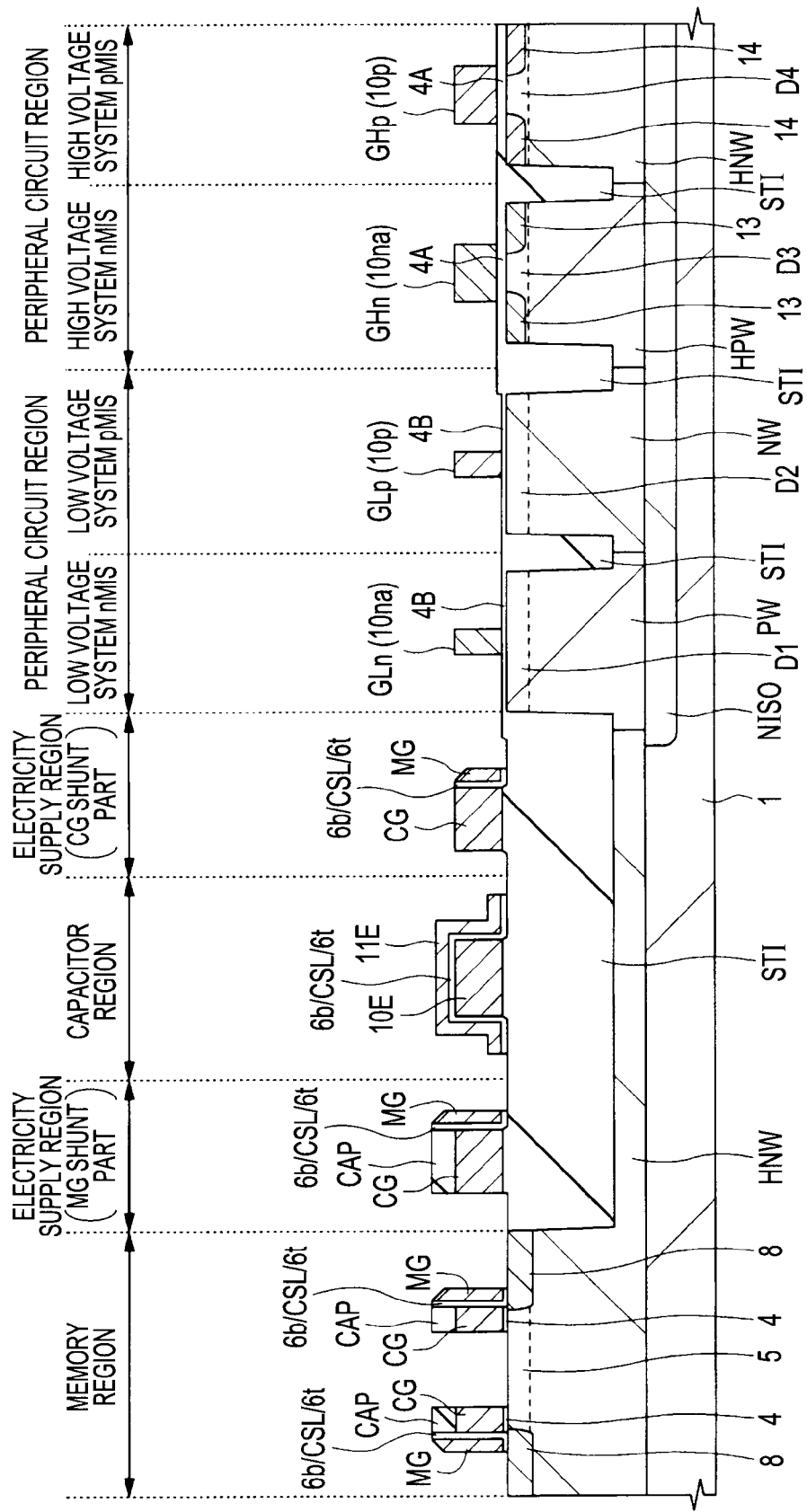
FIG. 17 is a section view of essential parts of the same portion as that in FIG. 9 during the manufacturing process of a semiconductor device, following FIG. 16.

Next, as shown in FIG. 17, by patterning the conductive films 10na, 10p in the peripheral circuit region through the use of the lithography technique and the dry etching technique, the low voltage system nMIS gate electrode GLn including the conductive film 10na, the low voltage system pMIS gate electrode GLp including the conductive film 10p, the high voltage system nMIS gate electrode GHn including the conductive film 10na, and the high voltage system pMIS gate electrode GHp including the conductive film 10p are formed. The gate length of the low voltage system nMIS gate electrode GLn and the low voltage system pMIS gate electrode GLp in the active region is, for example, about 100 nm and the gate length of the high voltage system nMIS gate electrode GHn and the high voltage system pMIS gate electrode GHp is, for example, about 400 nm.

Next, by ion-injecting impurities such as arsenic, into the main surface of the semiconductor substrate 1 in the high voltage system nMIS region in the peripheral circuit region through the use of a resist pattern as a mask, an n⁻-type semiconductor region 13 is formed in a self-alignment manner for the gate electrode GHn over the main surface of the semiconductor substrate 1 in the high voltage system nMIS region in the peripheral circuit region. Similarly, by ion-injecting impurities such as boron fluoride, into the main surface of the semiconductor substrate 1 in the high voltage system pMIS region in the peripheral circuit region through the use of a resist pattern as a mask, a p⁻-type semiconductor region 14 is formed in a self-alignment manner for the gate electrode GHp over the main surface of the semiconductor substrate 1 in the high voltage system pMIS region in the peripheral circuit region.

Figure 18:
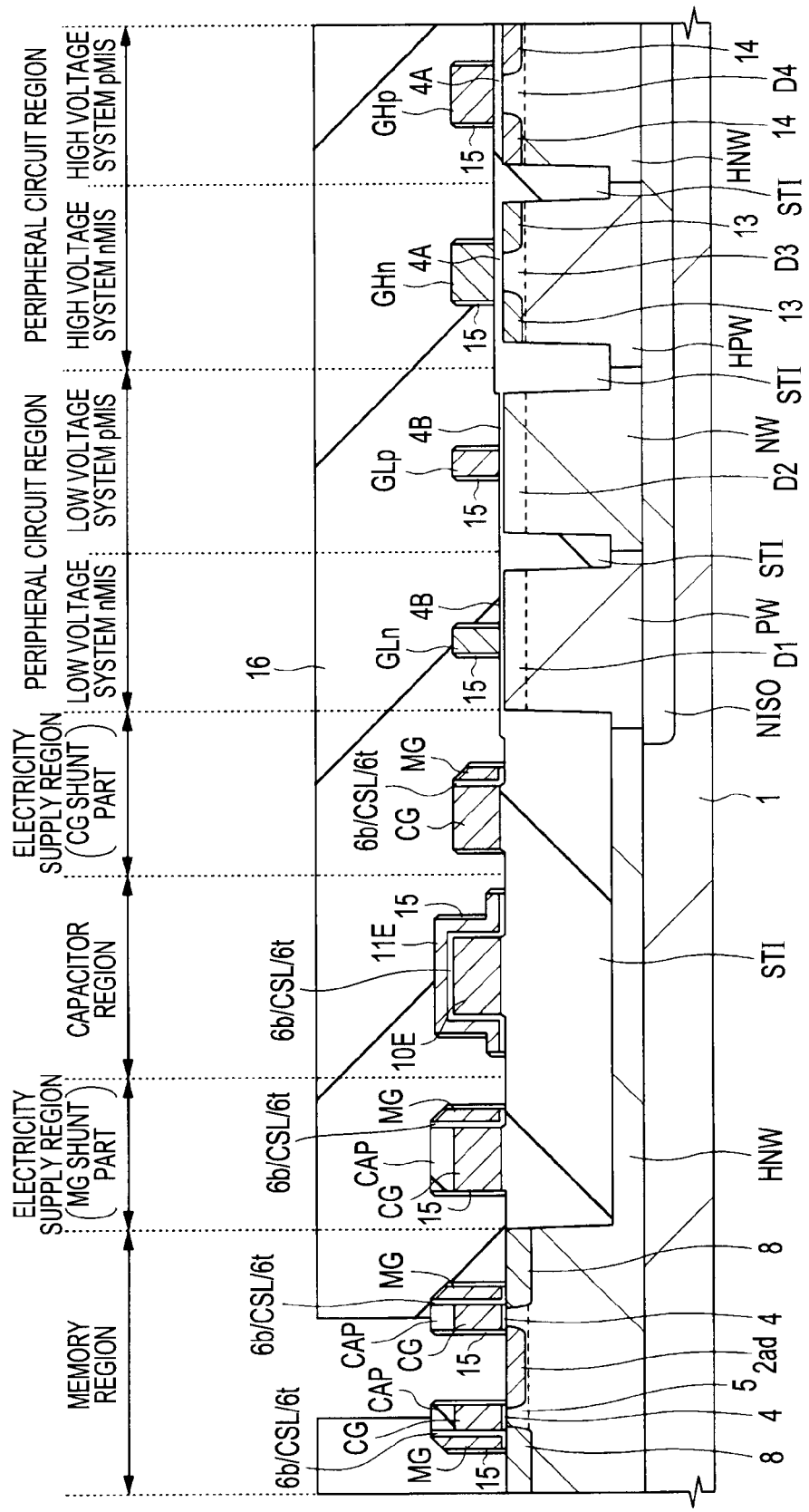
FIG. 18 is a section view of essential parts of the same portion as that in FIG. 9 during the manufacturing process of a semiconductor device, following FIG. 17.

Next, as shown in FIG. 18, after depositing an insulating film including, for example, silicon oxide, and having a thickness of about 10 nm by the CVD method over the main surface of the semiconductor substrate 1, the insulating film is etched back by the anisotropic dry etching method. Because of this, a sidewall 15 is formed on the side surface on the opposite side of the memory gate electrode MG of the laminated film including the cap insulating film CAP and the selection gate electrode CG and on the side surface of the memory gate electrode MG in the memory region and the electricity supply region, and on the side surface of the upper electrode 11E in the capacitor region, and on both side surfaces of the low voltage system nMIS gate electrode GLn, the low voltage system pMIS gate electrode GLp, the high voltage system nMIS gate electrode GHn, and the high voltage system pMIS gate electrode GHp in the peripheral circuit region, respectively. The spacer length of the sidewall 15 is, for example, about 6 nm. Because of this, it is possible to cover with the sidewall 15 the exposed side surface of the first gate insulating film 4 between the selection gate electrode CG of the selection pMIS (Qpc) and the semiconductor substrate 1, and the exposed side surfaces of the insulating films 6b, 6t and the charge storage layer CSL, between the memory gate electrode MG of the memory pMIS (Qpm) and the semiconductor substrate 1.

Next, after forming a resist pattern 16, the end part of which is located on the top surface of the selection gate electrode CG of the selection pMIS (Qpc), and which covers part of the selection gate electrode CG on the memory gate electrode MG side of the memory pMIS (Qpm) and the memory gate electrode MG, the p⁻-type semiconductor region 2ad is formed in a self-alignment manner for the selection gate electrode CG over the main surface of the semiconductor substrate 1 by ion-injecting impurities such as, for example, boron fluoride or boron, into the main surface of the semiconductor substrate 1 through the use of the selection gate electrode CG, the memory gate electrode MG, and the resist pattern 16 as a mask.

Figure 19:
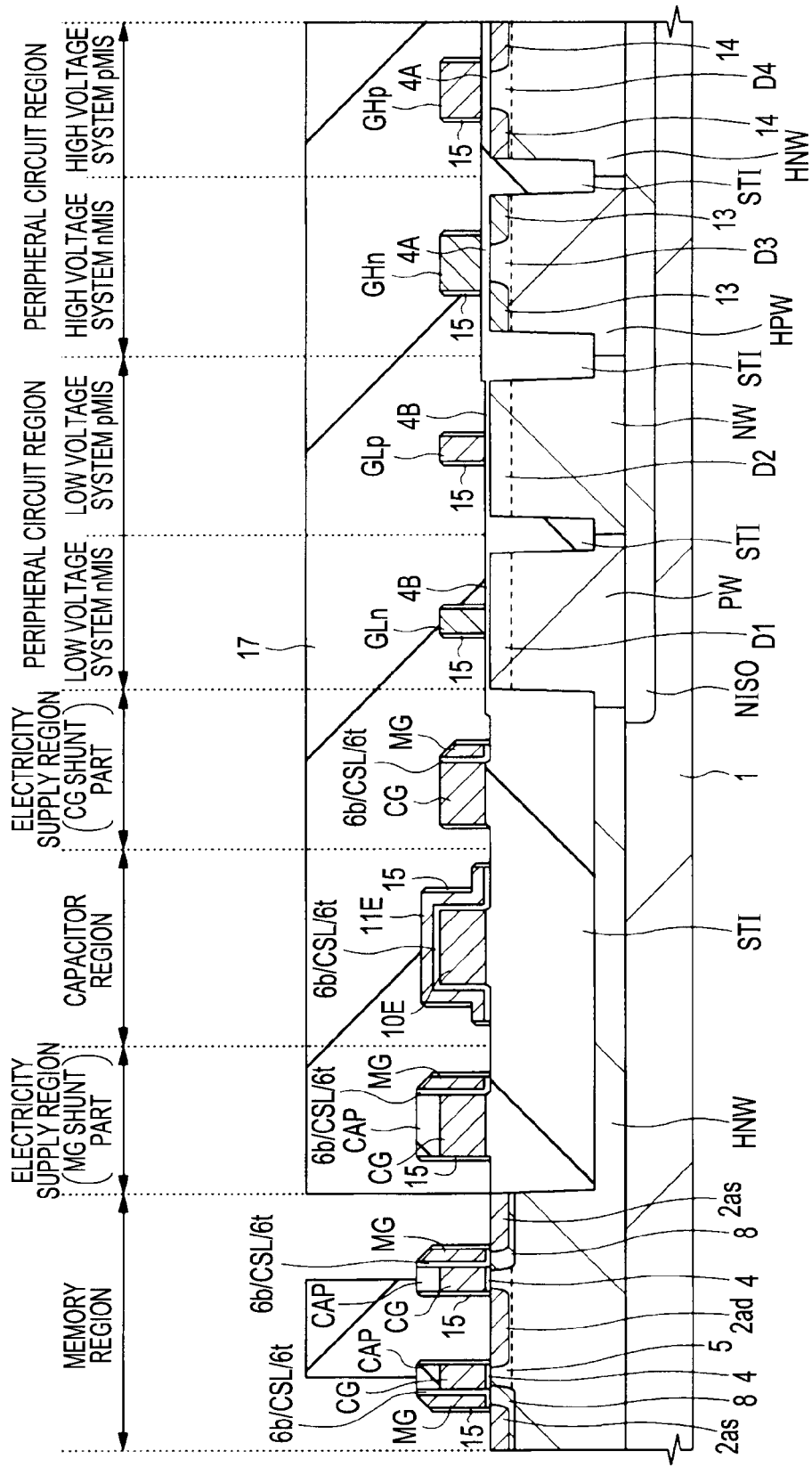
FIG. 19 is a section view of essential parts of the same portion as that in FIG. 9 during the manufacturing process of a semiconductor device, following FIG. 18.

Next, as shown in FIG. 19, after removing the resist pattern 16 and after forming a resist pattern 17, the end part of which is located on the top surface of the selection gate electrode CG of the selection pMIS (Qpc) in the memory region, and which covers part of the selection gate electrode CG on the opposite side of the memory gate electrode MG of the memory pMIS (Qpm), the p⁻-type semiconductor region 2as is formed in a self-alignment manner for the memory gate electrode MG over the main surface of the semiconductor substrate 1 by ion-injecting impurities such as, for example, boron fluoride or boron, into the main surface of the semiconductor substrate 1 through the use of the selection gate electrode CG, the memory gate electrode MG, and the resist pattern 17 as a mask.

Here, although the p⁻-type semiconductor region 2ad is formed first and then, the p⁻-type semiconductor region 2as is formed, it may also be possible to form the p⁻-type semiconductor region 2as first and then form the p⁻-type semiconductor region 2ad. Further, it may also be possible to form an n-type semiconductor region so as to surround the lower part of the p⁻-type semiconductor region 2ad by ion-injecting impurities such as, for example, arsenic or phosphorus, into the main surface of the semiconductor substrate 1 following the ion-injection of impurities for forming the p⁻-type semiconductor region 2ad.

Figure 20:
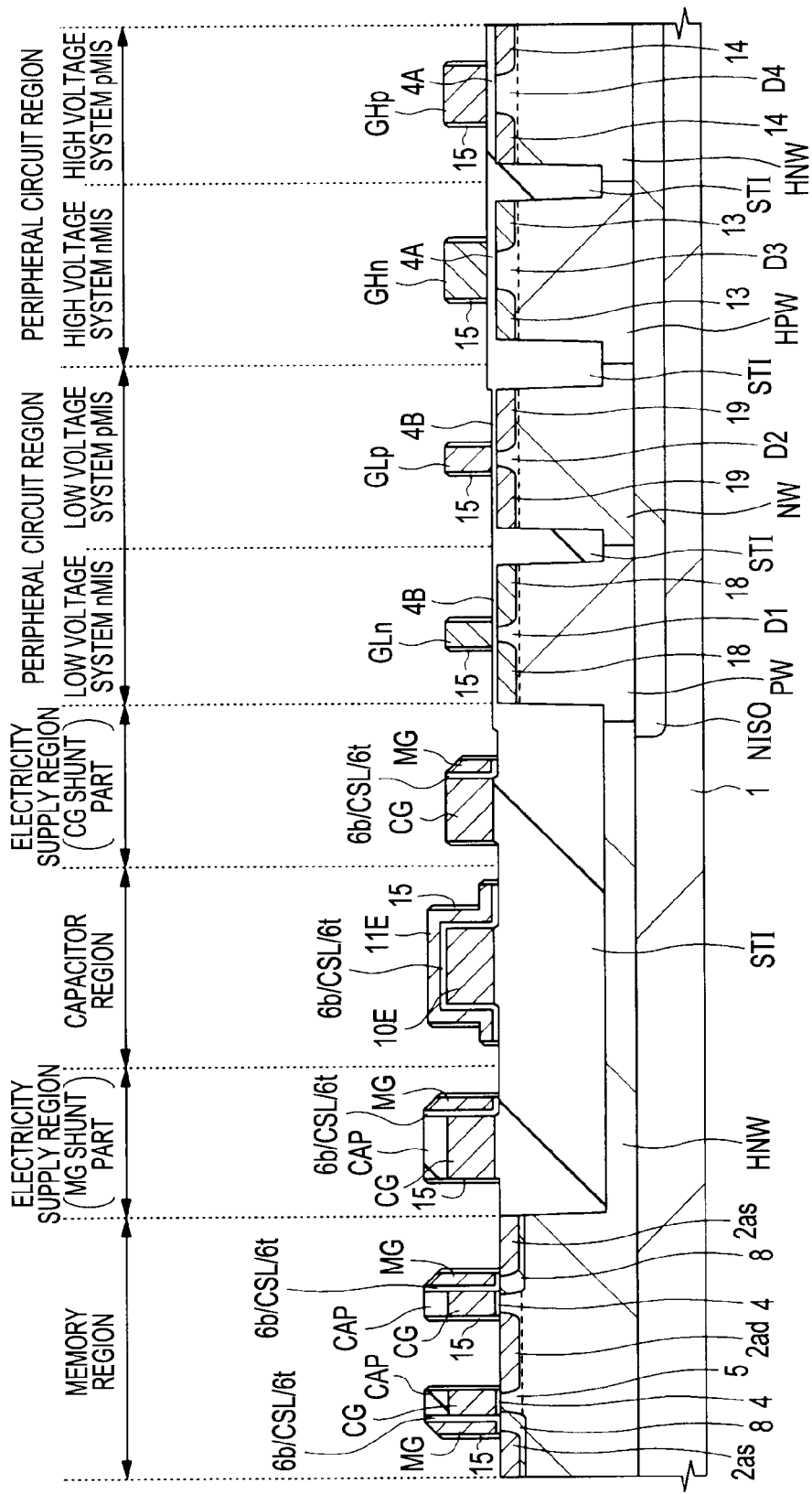
FIG. 20 is a section view of essential parts of the same portion as that in FIG. 9 during the manufacturing process of a semiconductor device, following FIG. 19.

Next, as shown in FIG. 20, an n⁻-type semiconductor region 18 is formed in a self-alignment manner for the gate electrode GLn over the main surface of the semiconductor substrate 1 in the low voltage system nMIS region in the peripheral circuit region by ion-injecting impurities such as, for example, arsenic, into the main surface of the semiconductor substrate 1 through the use of a resist pattern as a mask. Similarly, a p⁻-type semiconductor region 19 is formed in a self-alignment manner for the gate electrode GLp over the main surface of the semiconductor substrate 1 in the low voltage system pMIS region in the peripheral circuit region by ion-injecting impurities such as, for example, boron fluoride, into the main surface of the semiconductor substrate 1 through the use of a resist pattern as a mask.

Figure 21:
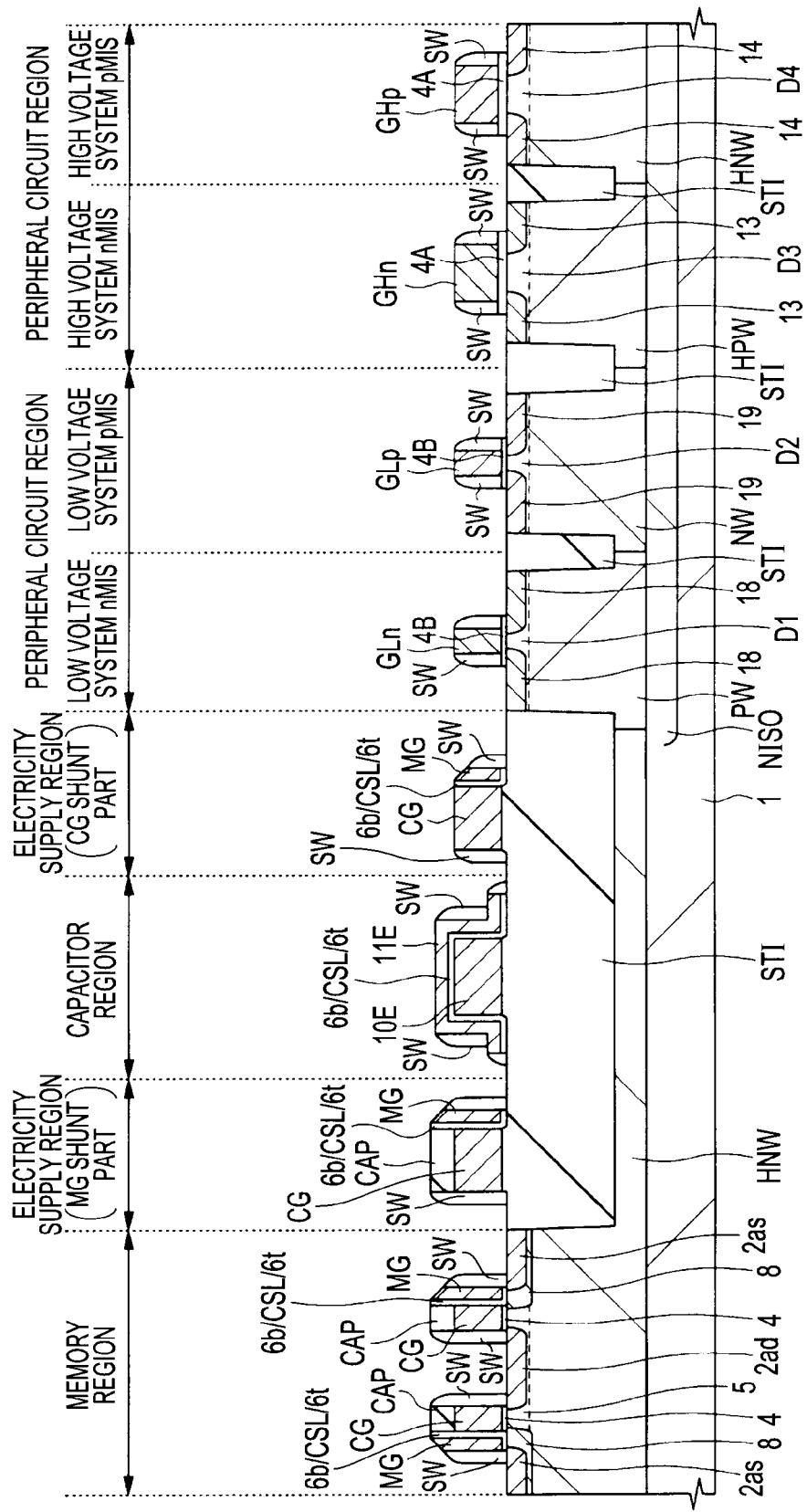
FIG. 21 is a section view of essential parts of the same portion as that in FIG. 9 during the manufacturing process of a semiconductor device, following FIG. 20.

Next, as shown in FIG. 21, over the main surface of the semiconductor substrate 1, for example, the silicon oxide film 7b, the silicon nitride film 7m, and the silicon oxide film 7t are deposited sequentially by the CVD method and they are etched back by the anisotropic dry etching method. Because of this, the sidewall SW is formed on the side surface on the opposite side of the memory gate electrode MG of the laminated film including the cap insulating film CAP and the selection gate electrode CG and on the side surface of the memory gate electrode MG in the memory region and the electricity supply region, and on the side surface of the upper electrode 11E in the capacitor region, and on both side surfaces of the low voltage system nMIS gate electrode LGn, the low voltage system pMIS gate electrode GLp, the high voltage system nMIS gate electrode GHn, and the high voltage system pMIS gate electrode GHp, respectively, in the peripheral circuit region. The thickness of the silicon oxide film 7b is, for example, about 20 nm, the thickness of the silicon nitride film 7m is, for example, about 25 nm, and the thickness of the silicon oxide film 7t is, for example, about 50 nm.

Figure 22:
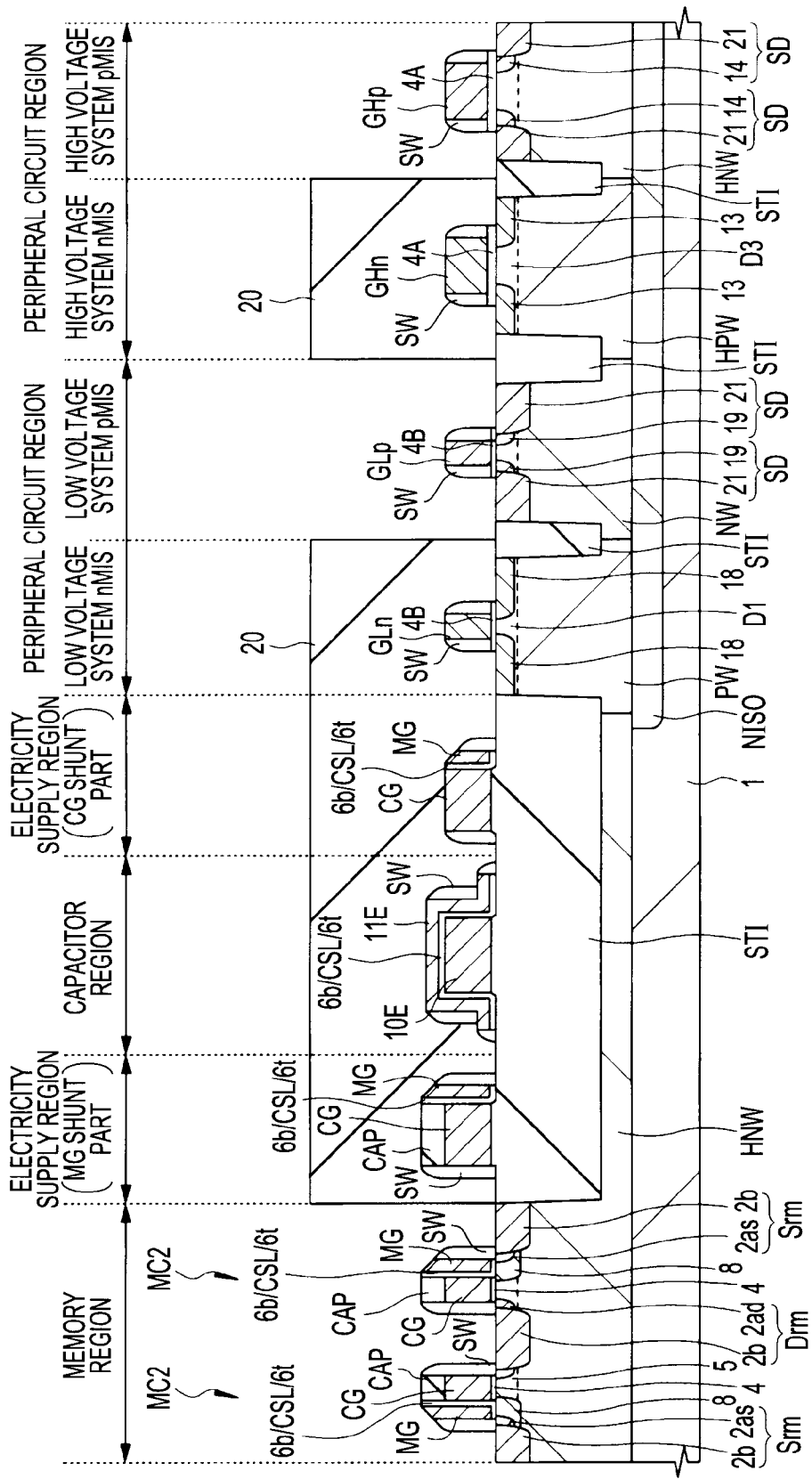
FIG. 22 is a section view of essential parts of the same portion as that in FIG. 9 during the manufacturing process of a semiconductor device, following FIG. 21.

Next, as shown in FIG. 22, the p⁺-type semiconductor region 2b is formed in a self-alignment manner for the selection gate electrode CG of the selection pMIS (Qpc) and the memory gate electrode MG of the memory pMIS (Qpm) in the memory region, and a p⁺-type semiconductor region 21 is formed in a self-alignment manner for the low voltage system pMIS gate electrode GLp the high voltage system pMIS gate electrode GHp in the peripheral circuit region by ion-injecting impurities, for example, boron or boron fluoride, into the main surface of the semiconductor substrate 1 in the memory region, and the low voltage system pMIS region and the high voltage system pMIS region in the peripheral circuit region through the use of a resist pattern 20 as a mask. Because of this, in the memory region, the drain region Drm including the p⁻-type semiconductor region 2ad and the p⁺-type semiconductor region 2b and the source region Srm including the p⁻-type semiconductor region 2 as and the p⁺-type semiconductor region 2b are formed. In the peripheral circuit region, a source/drain region SD of the high voltage system pMIS including the p⁻-type semiconductor region 14 and the p⁺-type semiconductor region 21 is formed, and the source/drain region SD of the low voltage system pMIS including the p⁻-type semiconductor region 19 and the p⁺-type semiconductor region 21 is formed.

Figure 23:
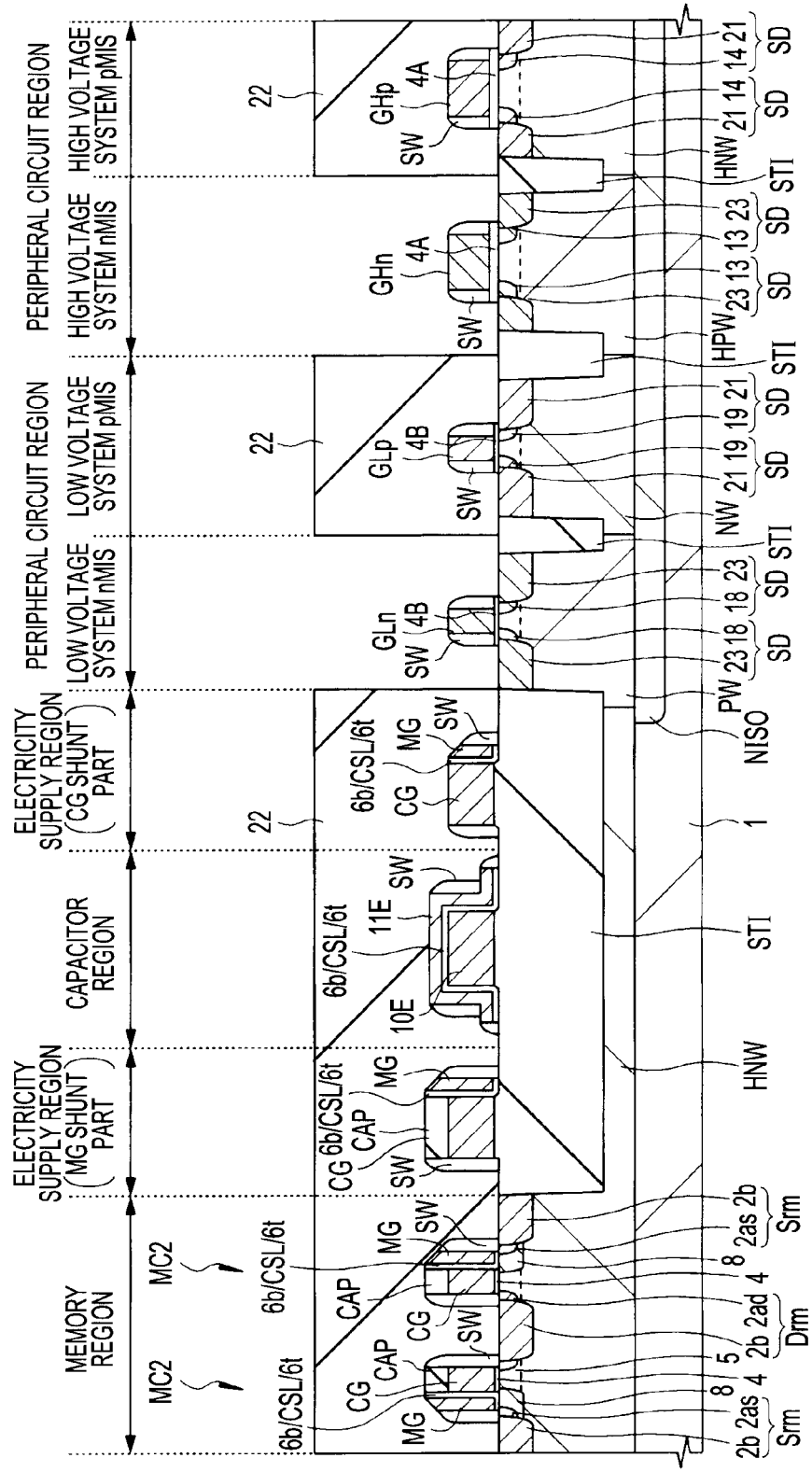
FIG. 23 is a section view of essential parts of the same portion as that in FIG. 9 during the manufacturing process of a semiconductor device, following FIG. 22.

Next, as shown in FIG. 23, an n⁺-type semiconductor region 23 is formed in a self-alignment manner for the low voltage system nMIS gate electrode GLn and the high voltage system nMIS gate electrode GHn by ion-injecting impurities such as, for example, arsenic and phosphorus, into the main surface of the semiconductor substrate 1 in the low voltage system nMIS region and the high voltage system nMIS region in the peripheral circuit region through the use of a resist pattern 22 as a mask. Because of this, the source/drain region SD of the high voltage system nMIS including the n⁻-type semiconductor region 13 and the n⁺-type semiconductor region 23 is formed, and the source/drain region SD of the low voltage system nMIS including the n⁻-type semiconductor region 18 and the n⁺-type semiconductor region 23 is formed.

Figure 24:
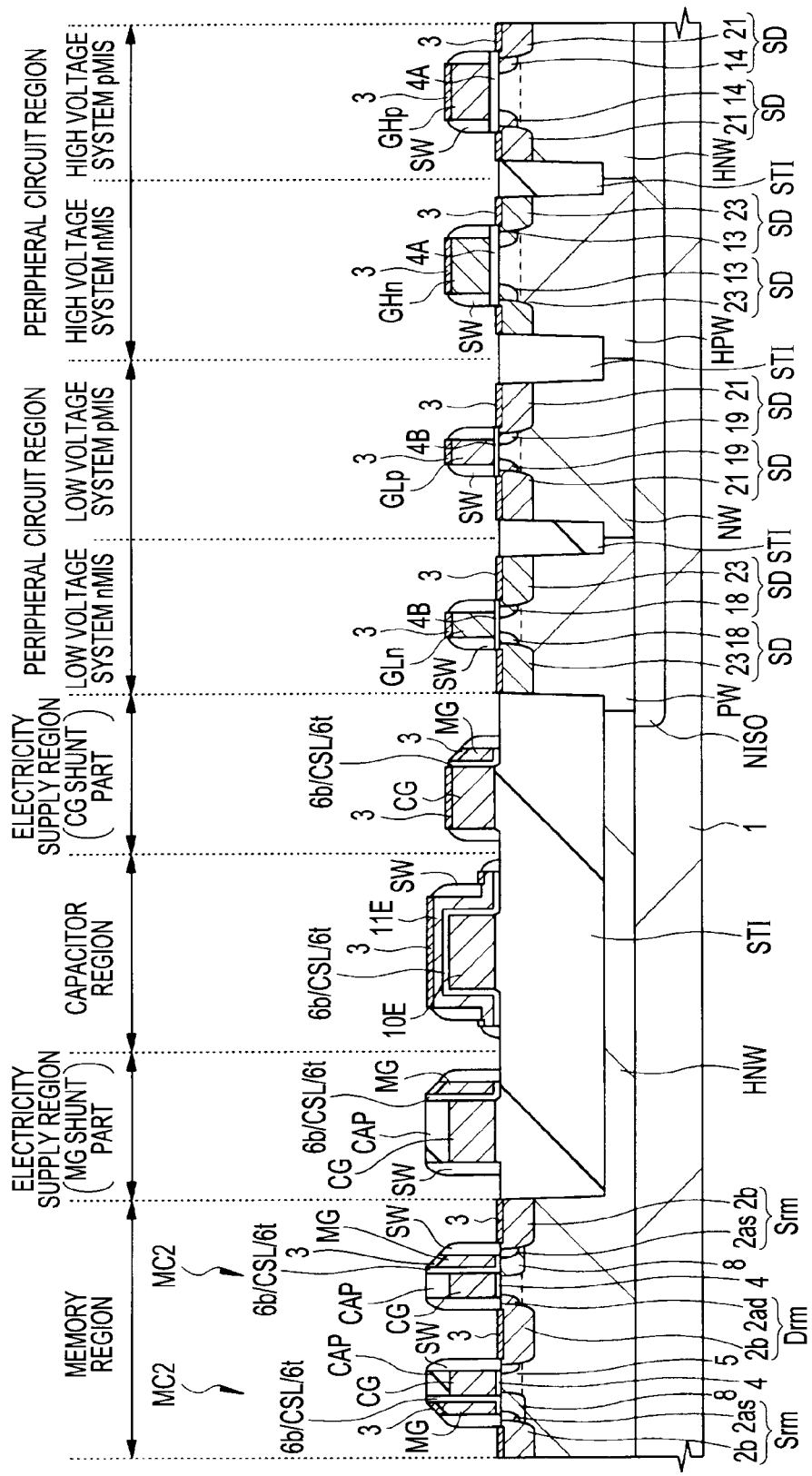
FIG. 24 is a section view of essential parts of the same portion as that in FIG. 9 during the manufacturing process of a semiconductor device, following FIG. 23.

Next, as shown in FIG. 24, the silicide layer 3, for example, nickel silicide or cobalt silicide, is formed by the self-alignment method, for example, the salicide (Self Align silicide) process on the top surface of the memory gate electrode MG of the memory pMIS (Qpm) and the top surface of the p⁺-type semiconductor region 2b in the memory region, on the top surface of the memory gate electrode MG of the memory pMIS (Qpm) in the MG shunt part, on the top surface of the selection gate electrode CG of the selection pMIS (Qpc) and on the top surface of the memory gate electrode MG of the memory pMIS (Qpm) in the CG shunt part in the electricity supply region, on the top surface of the low voltage system nMIS gate electrode GLn and the top surface of the n⁺-type semiconductor region 23, on the top surface of the low voltage system pMIS gate electrode GLp and the top surface of the p⁺-type semiconductor region 21, on the top surface of the high voltage system pMIS gate electrode GHp and the top surface of the n⁺-type semiconductor region 23, and on the top surface of the high voltage system pMIS gate electrode GHp and the top surface of the p⁺-type semiconductor region 21 in the peripheral circuit region, and on the top surface of a part of the upper electrode 11E, which does not overlap the selection gate electrode CG or the sidewall SW in a planar manner in the capacitor region.

By forming the silicide layer 3, it is possible to reduce the contact resistance between the silicide layer 3 and the plug etc. formed on the top part thereof. Further, in the memory region, it is possible to reduce the resistance of the memory gate electrode MG of the memory pMIS (Qpm) and the source region Srm and the drain region Drm themselves. Furthermore, in the peripheral circuit region, it is possible to reduce the resistance of the low voltage system nMIS gate electrode GLn, the low voltage system pMIS gate electrode GLp, the high voltage system nMIS gate electrode GHn, and the high voltage system pMIS gate electrode GHp themselves, and the resistance of the source/drain region SD itself.

Figure 25:
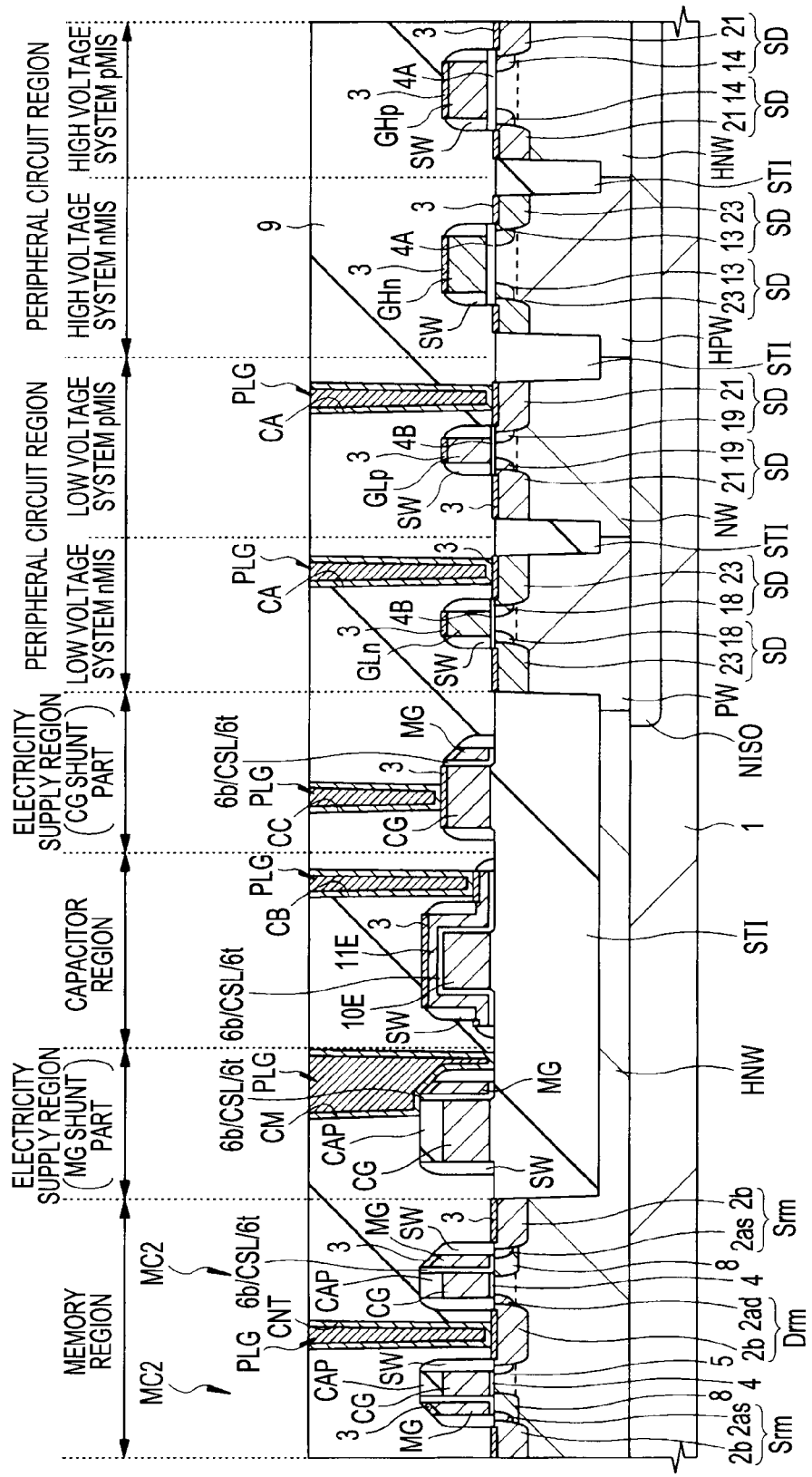
FIG. 25 is a section view of essential parts of the same portion as that in FIG. 9 during the manufacturing process of a semiconductor device, following FIG. 24.

Next, as shown in FIG. 25, the interlayer insulating film 9 is formed over the main surface of the semiconductor substrate 1. The interlayer insulating film includes, for example, silicon oxide, and is formed by, for example, the CVD method. Subsequently, in the memory region, the contact hole CNT that reaches the silicide layer 3 over the drain region Drm is formed in the interlayer insulating film 9. At the same time, although the contact hole CNT that reaches the silicide layer 3 over the source region Srm is also formed, only the contact hole CNT that reaches the silicide layer 3 over the drain region Drm is shown schematically in FIG. 25 for the sake of simplification of explanation.

At the same time, in the electricity supply region, a contact hole CC that reaches the silicide layer 3 over the selection gate electrode CG of the selection pMIS (Qpc) in the CG shunt part is formed, and a contact hole CM that reaches the silicide layer 3 over the memory gate electrode MG of the memory pMIS (Qpm) in the MG shunt part is formed in the interlayer insulating film 9. The contact hole CM formed in the MG shunt part is in a state where it has stranded on the selection gate electrode CG in consideration of the margin for the positional alignment between the memory gate electrode MG and the contact hole CM, and the margin for dimensional variations. But, over the top surface of the selection gate electrode CG, the cap insulating film CAP is formed, and therefore, it is unlikely that the contact hole CM is coupled with the selection gate electrode CG.

Further, in the peripheral circuit region, a contact hole CA that reaches the silicide layer 3 over the source/drain region SD of the low voltage system nMIS and the low voltage system pMIS, respectively, is formed. In FIG. 25, only the contact hole CA that reaches the silicide layer 3 over the source/drain region SD of the low voltage system nMIS and the low voltage system pMIS is shown schematically for the sake of simplification of explanation. Further, in the capacitor region, in the part of the upper electrode 11E where the selection gate electrode CG and the sidewall W do not overlap the lower electrode 10E in a planar manner, a contact hole CB that reaches the silicide layer 3 on the top surface of the upper electrode 11E and the lower electrode 10E is formed. In FIG. 25, only the contact hole CB that reaches the silicide layer 3 over the upper electrode 11E is shown schematically for the sake of simplification of explanation.

Next, the plug PLG is formed in the contact holes CNT, CC, CM, CA, CB. The plug PLG includes a laminated film including a relatively thin barrier film including a laminated film of, for example, titanium and titanium nitride, and a relatively thick film including tungsten or aluminum, etc., formed so as to be covered by the barrier film. After that, by forming a first layer wire (not shown schematically) containing, for example, copper or aluminum as its principal component, over the interlayer insulating film 9, the memory cell MC2, the capacitive element, and the low voltage system nMIS, the low voltage system pMIS, the high voltage system nMIS, and the high voltage system pMIS formed in the peripheral circuit region are substantially completed. After that, a semiconductor device having a nonvolatile memory is manufactured through the normal manufacturing processes of a semiconductor device.

Figure 26:
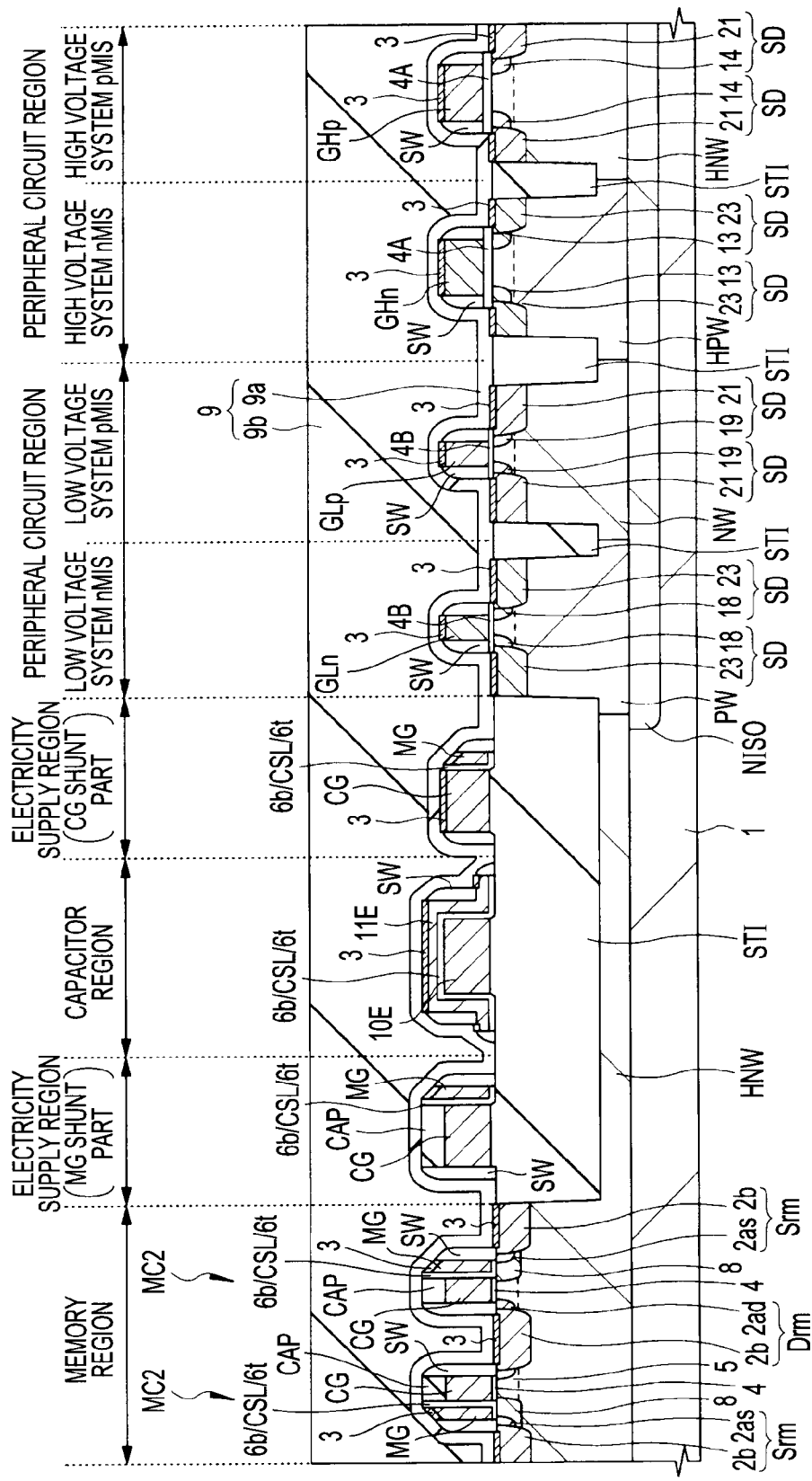
FIG. 26 is a section view of essential parts of nMIS and pMIS formed in a nonvolatile memory cell and a peripheral circuit region formed in a memory region according to the second embodiment of the present invention.

In the second embodiment, although the interlayer insulating film 9 includes a silicon oxide single layer, it may include a laminated film in which two or more layers of an insulating film are laminated. For example, as shown in FIG. 26, it is also possible to form the interlayer insulating film 9 including a silicon nitride film 9a and a silicon oxide film 9b by depositing, for example, the silicon nitride film (fourth insulating film) 9a through the use of the CVD method, and subsequently, by depositing, for example, the silicon oxide film (third insulating film) 9b through the use of the CVD method. The thickness of the silicon nitride film 9a is, for example, about 30 to 50 nm.

When dry-etching the silicon oxide film 9b in order to form the contact holes CNT, CC, CM, CA, CB in the interlayer insulating film 9, it is possible to form an opening without reducing the sidewall SW that overlaps the opening of etching by using the above-mentioned silicon nitride film 9a as an etching stopper film of the silicon oxide film 9b. After that, by removing the silicon nitride film 9a at the lower part of the opening, it is possible to form the contact holes CNT, CC, CM, CA, CB in a self-alignment manner.

Figure 27:
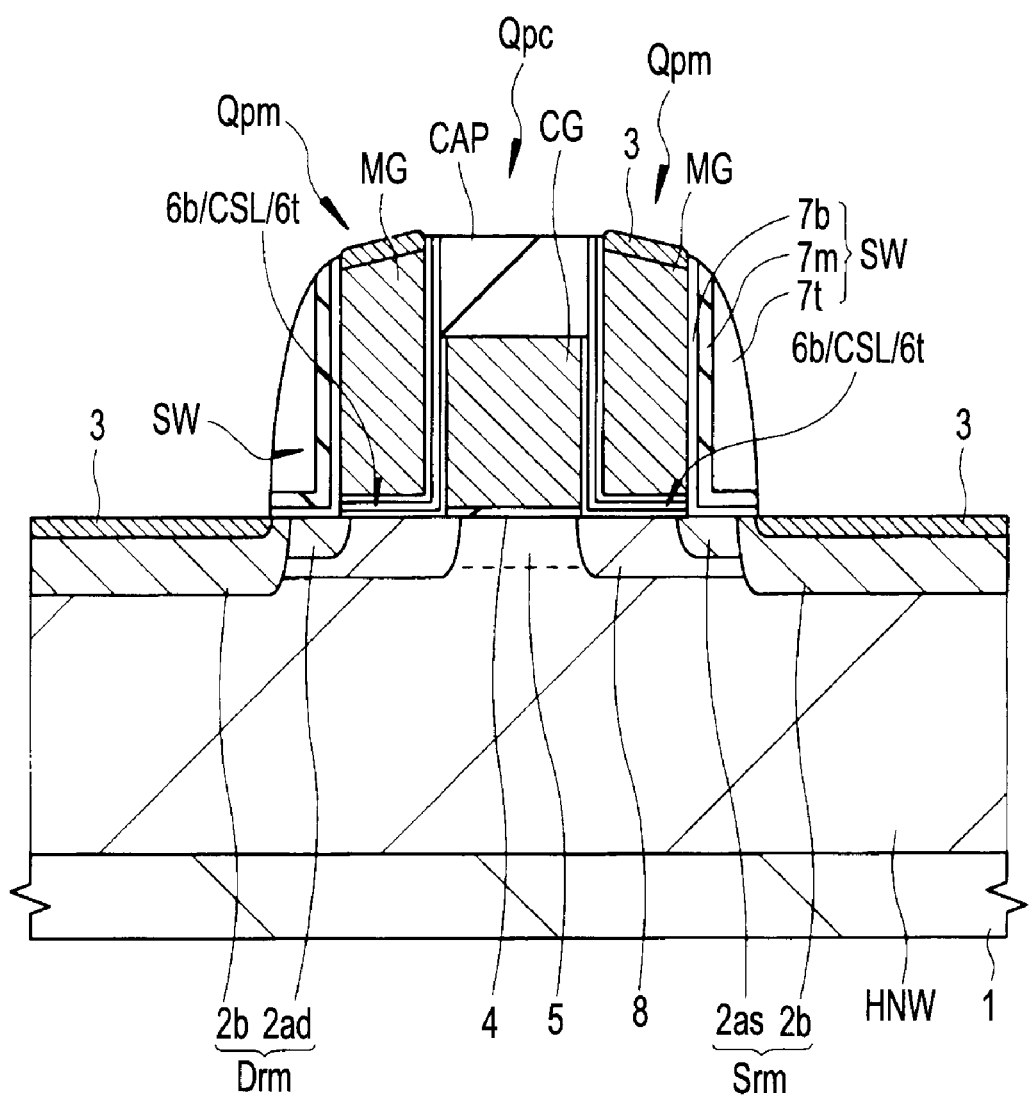
FIG. 27 is a section view of essential parts of a nonvolatile memory cell with a split gate structure (structure having a memory gate electrode in the form of a sidewall on both side surfaces of a selection pMIS selection gate electrode) according to the second embodiment of the present invention.
Figure 28:
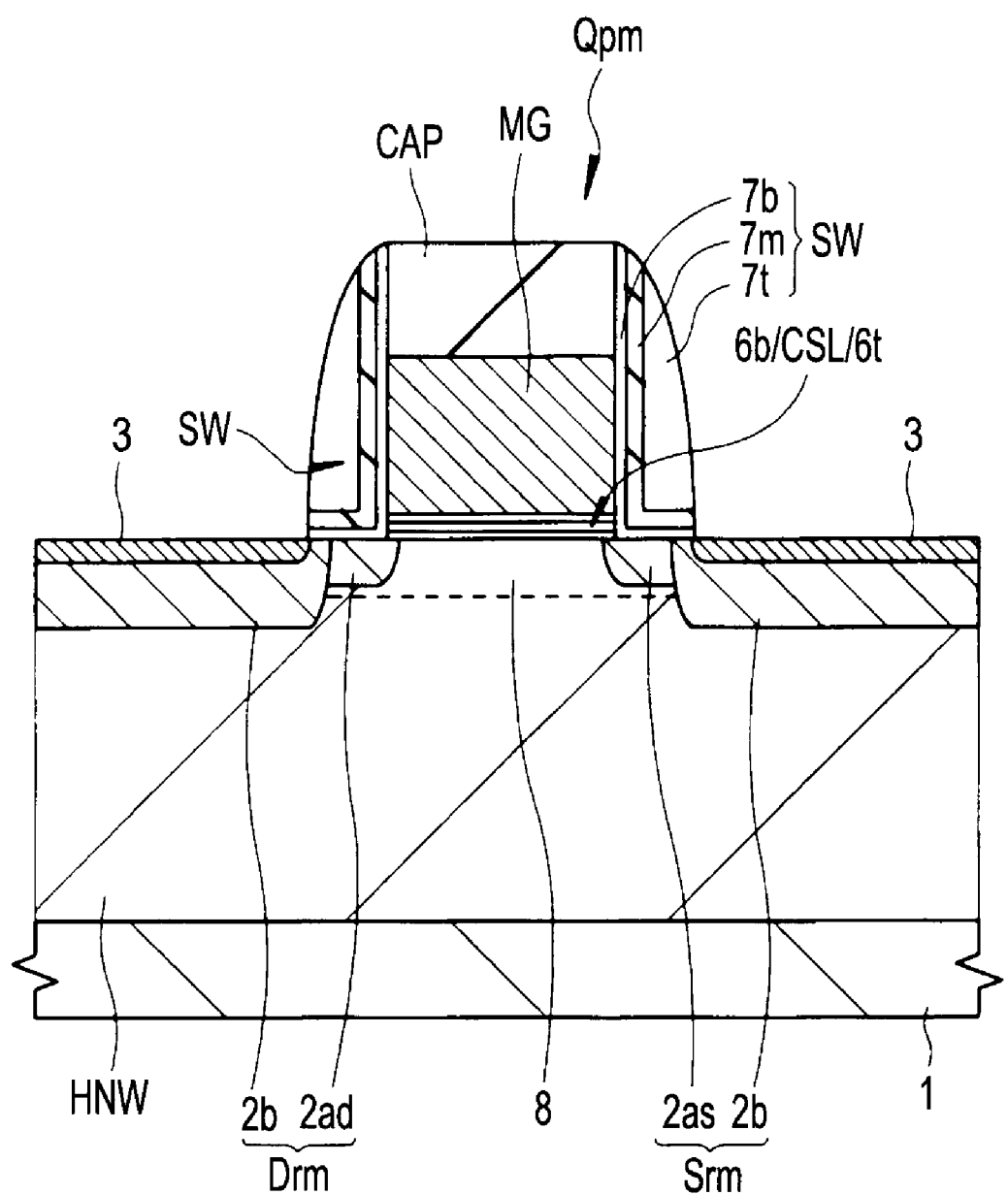
FIG. 28 is a section view of essential parts of a single structure nonvolatile memory cell according to the second embodiment of the present invention.

In the second embodiment, the MONOS type nonvolatile memory cell with a split gate structure is shown as an example, in which the memory gate electrode MG of the memory pMIS (Qpm) in the form of a sidewall is formed over one side surface of the selection gate electrode CG of the selection pMIS (Qpc), but the cell is not limited. For example, it is possible to apply the invention of the subject application explained in the second embodiment also to a MONOS type nonvolatile memory cell with a split gate structure, in which the memory gate electrode MG of the memory pMIS (Qpm) in the form of a sidewall is formed on both side surfaces of the selection gate electrode CG of the selection pMIS (Qpc) shown in FIG. 27. Further, it is possible to apply the invention of the subject application explained in the second embodiment also to a MONOS type nonvolatile memory cell with a single structure shown in FIG. 28.

(Third Embodiment)

In a third embodiment, as in the second embodiment described above, a MONOS type nonvolatile memory cell with a split gate structure is used as a p-type memory cell including the selection pMIS (Qpc) and the memory pMIS (Qpm), and over the top surface of the selection gate electrode CG of the selection pMIS (Qpc), the cap insulating film CAP is formed, which causes compression stress to occur, in the channel region (between the source region Srm and the drain region Drm) under the selection gate electrode CG. A difference from the second embodiment described above lies in the fact that an insulating film having compression stress is formed over the p-type memory cell formed in the memory region and over the low voltage system pMIS and the high voltage system pMIS formed in the peripheral circuit region, and an insulating film having tensile stress is formed over the low voltage system nMIS and the high voltage system nMIS formed in the peripheral circuit region. The explanation of such compression stress and tensile stress is the same as that of the stress of the cap insulating film given in the previous embodiment.

Figure 29:
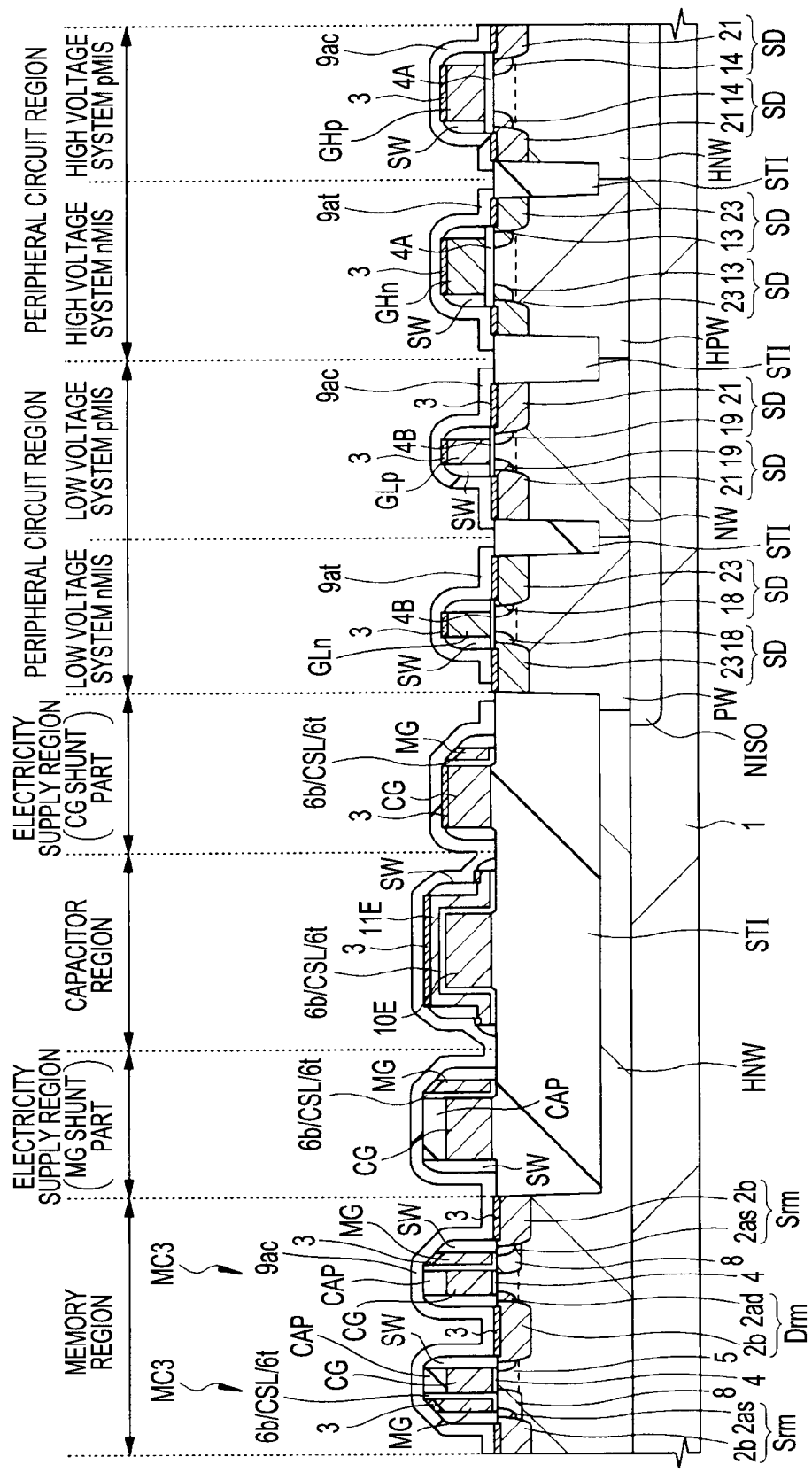
FIG. 29 is a section view of essential parts of a memory region, electricity supply regions (MG shunt part and CG shunt part), a capacitor region, and peripheral circuit regions (low voltage system nMIS region, low voltage system pMIS region, high voltage system nMIS region, and high voltage system pMIS region), showing a manufacturing process of a semiconductor device according to a third embodiment of the present invention.

As shown in FIG. 29, a memory cell MC 3 formed in the memory region is covered with a first insulating film having compression stress, for example, a silicon nitride film 9ac. It is possible to increase the drive current of the memory cell MC3 formed in the memory region by using the cap insulating film CAP and the silicon nitride film 9ac having compression stress as described above.

Further, the low voltage system pMIS and the high voltage system pMIS formed in the peripheral circuit region are covered with a first insulating film having compression stress, for example, the silicon nitride film 9ac. It is possible to increase the drive current of the low voltage system pMIS and the high voltage system pMIS formed in the peripheral circuit region by using the silicon nitride film 9ac having compression stress as described above.

On the other hand, the low voltage system nMIS and the high voltage system nMIS formed in the peripheral circuit region are covered with a second insulating film having tensile stress, for example, a silicon nitride film 9at. It is possible to increase the drive current of the low voltage system nMIS and the high voltage system nMIS formed in the peripheral circuit region by using the silicon nitride film 9at having tensile stress as described above. Consequently, it becomes possible to enhance the operation speed by increasing the drive current in the memory cell MC3 formed in the memory region, and in the low voltage system nMIS, the low voltage system pMIS, the high voltage system nMIS, and the high voltage system pMIS, formed in the peripheral circuit region.

It is also possible to use the silicon nitride film 9ac and the silicon nitride film 9at as an etching stopper film when forming a self-alignment contact as described above.

In a specific manufacturing method, first the silicon nitride film 9at is deposited over the main surface of the semiconductor substrate 1 and then the silicon nitride film 9at of the memory cell MC3, the low voltage system pMIS, and the high voltage system pMIS is removed. After that, the silicon nitride film 9ac is deposited over the main surface of the semiconductor substrate 1 and then the silicon nitride film 9ac of the low voltage system nMIS and the high voltage system nMIS is removed. It may also be possible to reverse the order, that is, first the silicon nitride film 9ac is formed and then the silicon nitride film 9at is formed.

In the third embodiment, the thickness of the silicon nitride films 9ac, 9at is set to, for example, about 30 to 50 nm. Further, the silicon nitride film 9ac is formed so as to cover not only the upper surface of the selection gate electrode CG, the low voltage system pMIS gate electrode GLp, and the high voltage system pMIS gate electrode GHp but also the sidewall of the selection gate electrode CG, the low voltage system pMIS gate electrode GLp, and the high voltage system pMIS gate electrode GHp, respectively, via the sidewall SW. Furthermore, the silicon nitride film 9at is formed so as to cover not only the upper surface of the low voltage system nMIS gate electrode GLn and the high voltage system nMIS gate electrode GHn but also the sidewall of the low voltage system nMIS gate electrode GLn and the high voltage system nMIS gate electrode GHn, respectively, via the sidewall SW. Because of this, even if the thickness is the same, stress greater than that of the cap insulating film CAP is applied to the channel region under the selection gate electrode CG of the memory cell MC3, the channel region of the low voltage system pMIS, the channel region of the low voltage system nMIS, the channel region of the high voltage system pMIS, and the channel region of the high voltage system nMIS. Thus, even if the film thickness of the silicon nitride films 9ac, 9at is smaller than that of the cap insulating film CAP, stress of substantially the same magnitude is applied to the channel region, as a result. The value of the stress of the silicon nitride films 9ac, 9at to be applied to the channel region under the selection gate electrode CG of the memory cell MC3, the channel region of the low voltage system pMIS, the channel region of the low voltage system nMIS, the channel region of the high voltage system pMIS, and the channel region of the high voltage system nMIS is 1.0 GPa to 1.7 GPa, respectively.

Although not shown schematically, over the silicon nitride films 9ac, 9at, for example, the silicon oxide film 9b explained in the second embodiment described above is formed, and the interlayer insulating film 9 is formed by a laminated film of the silicon nitride films 9ac, 9at and the silicon oxide film 9b.

In the third embodiment, the MONOS type nonvolatile memory cell with a split gate structure is shown as an example, in which the memory gate electrode MG of the memory pMIS (Qpm) in the form of a sidewall is formed over one side surface of the selection gate electrode CG of the selection pMIS (Qpc), but the cell is not limited. For example, it is possible to apply the invention of subject application explained in the third embodiment also to a MONOS type nonvolatile memory cell with a split gate structure, in which the memory gate electrode MG of the memory pMIS (Qpm) in the form of a sidewall is formed on both side surfaces of the selection gate electrode CG of the selection pMIS (Qpc), or to a MONOS type nonvolatile memory cell with a single structure.

(Fourth Embodiment)

A fourth embodiment is a modified example of the third embodiment described above. In the fourth embodiment, as in the third embodiment described above, a MONOS type nonvolatile memory cell with a split gate structure is used as a p-type memory cell including the selection pMIS (Qpc) and the memory pMIS (Qpm), and over the p-type memory cell formed in the memory region and over the low voltage system pMIS and the high voltage system pMIS formed in the peripheral circuit region, an insulating film having compression stress is formed, and over the low voltage system nMIS and the high voltage system nMIS formed in the peripheral circuit region, an insulating film having tensile stress is formed. A difference from the third embodiment described above lies in fact that the cap insulating film is not formed over the top surface of the selection gate electrode CG of the selection pMIS (Qpc).

Figure 30:
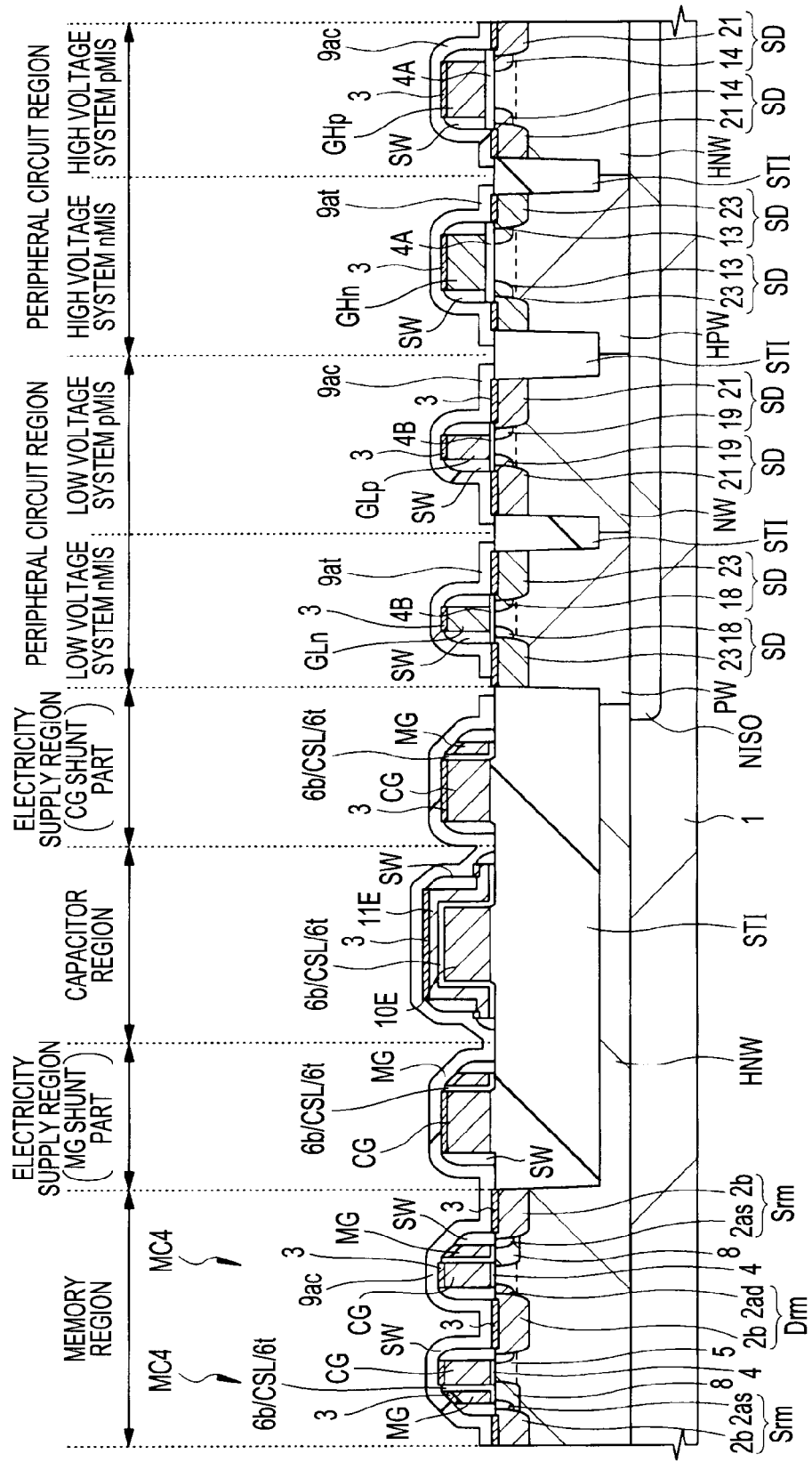
FIG. 30 is a section view of essential parts of a memory region, electricity supply regions (MG shunt part and CG shunt part), a capacitor region, and peripheral circuit regions (low voltage system nMIS region, low voltage system pMIS region, high voltage system nMIS region, and high voltage system pMIS region), showing a manufacturing process of a semiconductor device according to a fourth embodiment of the present invention.
Figure 31:
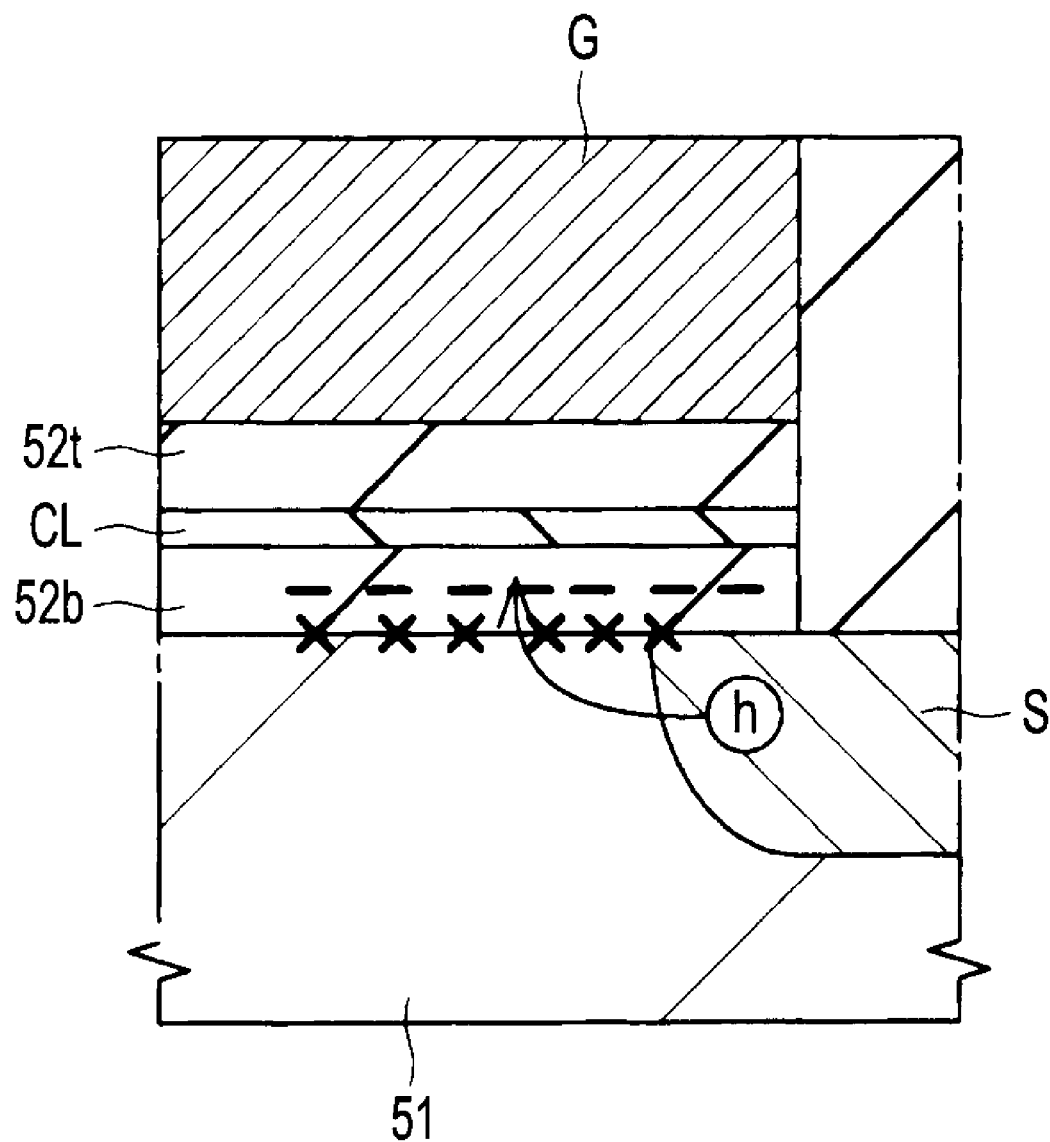
FIG. 31 is an enlarged section view of essential parts of a memory cell for explaining write of data to an n-type memory cell the inventors of the present invention have discussed.

As shown in FIG. 30, a memory cell MC4 formed in the memory region and the low voltage system pMIS and the high voltage system pMIS formed in the peripheral circuit region are covered with a first insulating film having compression stress, for example, the silicon nitride film 9ac. By using the silicon nitride film 9ac having compression stress as described above, it is possible to increase the drive current in the memory cell MC4 formed in the memory region, and in the low voltage system pMIS and the high voltage system pMIS formed in the peripheral circuit region.

On the other hand, the low voltage system nMIS and the high voltage system nMIS formed in the peripheral circuit region are covered with a second insulating film having tensile stress, for example, the silicon nitride film 9at. By using the silicon nitride film 9at having tensile stress as described above, it is possible to increase the drive current in the low voltage system nMIS and the high voltage system nMIS formed in the peripheral circuit region.

Consequently, it becomes possible to increase the operation speed by increasing the drive current in the memory cell MC4 formed in the memory region, and in the low voltage system nMIS, the low voltage system pMIS, the high voltage system nMIS, and the high voltage system pMIS, formed in the peripheral circuit region. The thickness of the silicon nitride films 9ac, 9at is, for example, about 30 to 50 nm.

Further, it is also possible to use the silicon nitride film 9ac and the silicon nitride film 9at as an etching stopper film when forming the self-alignment contact as described above.

The explanation of the stress of the silicon nitride films 9ac, 9at is the same as that of the third embodiment described above. The manufacturing method of the silicon nitride films 9ac, 9at is also the same.

In the fourth embodiment, the MONOS type nonvolatile memory cell with a split gate structure is shown as an example, in which the memory gate electrode MG of the memory pMIS (Qpm) in the form of a sidewall is formed over one side surface of the selection gate electrode CG of the selection pMIS (Qpc), but the cell is not limited. For example, it is possible to apply the invention of the subject application explained in the fourth embodiment also to a MONOS type nonvolatile memory cell with a split gate structure, in which the memory gate electrode MG of the memory pMIS (Qpm) in the form of a sidewall is formed on both side surfaces of the selection gate electrode CG of the selection pMIS (Qpc), or to a MONOS type nonvolatile memory cell with a single structure.

(Fifth Embodiment)

A fifth embodiment is a modified example of the third embodiment described above. In the fifth embodiment, only the silicon nitride film 9at having tensile stress is formed over the memory cell MC, the low voltage system pMIS, the low voltage system nMIS, the high voltage system pMIS, and the high voltage system nMIS, but the silicon nitride film 9ac having compression stress is not formed. That is, the silicon nitride film 9at having tensile stress is used instead of the silicon nitride film 9a shown in FIG. 26 described above.

In the fifth embodiment, it is not necessary to separately manufacture the silicon nitride films 9ac, 9at unlike the third embodiment described above, and therefore, it is possible to eliminate a mask and simplify the manufacturing processes. In this case, the drive force of the low voltage system pMIS and the high voltage system pMIS is reduced, but this case is useful when priority is given to the drive force of the low voltage system nMIS and the high voltage system nMIS and the reduction of the manufacturing cost is desired.

Further, it is also possible to use the silicon nitride film 9at as an etching stopper film when forming a self-alignment contact as described above.

Here, in the memory cell MC, the cap insulating film CAP having compression stress and the silicon nitride film 9at having tensile stress are formed as a result. At this time, it is desirable for the channel region under the selection gate electrode CG in the memory cell MC to be in the state where compression stress is caused to occur or in the state where neither compression stress nor tensile stress is caused to occur. Consequently, it is desirable that the film thickness of the cap insulating film CAP be formed so as to be greater than the film thickness of the silicon nitride film 9at.

The explanation of the stress of the cap insulating film CAP and the silicon nitride film 9at is the same as that in the third embodiment described above. Consequently, as described above, it is desirable for the channel region under the selection gate electrode CG in the memory cell MC to be in the state where compression stress is caused to occur or in the state where neither compression stress nor tensile stress is caused to occur.

(Sixth Embodiment)

A sixth embodiment is another modified example of the third embodiment described above. In the sixth embodiment, only the silicon nitride film 9ac having compression stress is formed over the memory cell MC, the low voltage system pMIS, the low voltage system nMIS, the high voltage system pMIS, and the high voltage system nMIS but the silicon nitride film 9at having tensile stress is not formed. That is, the silicon nitride film 9ac having compression stress is used instead of the silicon nitride film 9a shown in FIG. 26 described above.

In the sixth embodiment, as in the fifth embodiment described above, it is not necessary to separately manufacture the silicon nitride films 9ac, 9at unlike the third embodiment described above, and therefore, it is possible to eliminate a mask and simplify the manufacturing processes. In this case, the drive force of the low voltage system nMIS and the high voltage system nMIS is reduced, but this case is useful when priority is given to the drive force of the memory cell MC, the low voltage system pMIS, and the high voltage system pMIS and the reduction of the manufacturing cost is desired.

Further, it is also possible to use the silicon nitride film 9ac as an etching stopper film when forming a self-alignment contact as described above.

The explanation of the stress of the cap insulating film CAP and the silicon nitride film 9ac is the same as that in the third embodiment described above.

The invention developed by the inventors of the invention is specifically explained based on the embodiments. However, it is needless to say that the present invention is not limited to the embodiments, but various modifications can be made within the scope not departing from its gist.

For example, in the fourth embodiment, the silicon nitride films 9at, 9ac are shown as an example, but any film can be used as long as it causes the above-described stress to occur or functions as an etching stopper such as a SiON (Silicon Oxynitride) film, a SiCN (Carbon doped Silicon Nitride) film, a SiOC (Carbon doped Silicon Oxide) film, a SiONC (Carbon doped Silicon Oxynitride) film, or a SiOF (Fluorine doped Silicon Oxide) film. When such a film is used, its dielectric constant is lower than that of, for example, the silicon nitride films 9at, 9ac, and therefore, it is possible to reduce the parasitic capacitance and improve the operation characteristics of the semiconductor device.

For example, in the fourth embodiment described above, although the silicon nitride films 9at, 9ac are shown as an example, it is not necessary for the film to be a single layer film, but the film may be formed by a laminated film as long as it has the same effect as that of the fourth embodiment. For the same reason, the cap insulating film CAP may be formed by a laminated film.

The present invention can be applied to a semiconductor product equipped with a charge trap type memory, such as a microcomputer equipped with an NAND type flash memory, a NOR type flash memory, or a flash memory.

What is claimed is:

1. A semiconductor device having a memory cell,
    wherein the memory cell has:
        a first well formed in a semiconductor substrate and exhibiting an n-type conductivity;
        a first gate insulating film formed over the first well;
        a selection gate electrode formed over the first gate insulating film and including a first conductive film exhibiting a p-type conductivity;
        a cap insulating film formed over the selection gate electrode;
        a memory gate electrode formed over one side surface of the selection gate electrode and the cap insulating film, the memory gate electrode including a second conductive film exhibiting a p-type conductivity;
        a second gate insulating film formed between the selection gate electrode and the memory gate electrode, formed between the cap insulating film and the memory gate electrode, and formed between the memory gate electrode and the semiconductor substrate, the second gate insulating film having a charge storage layer; and
        a first source region exhibiting a p-type conductivity and a first drain region exhibiting a p-type conductivity, both formed in the first well,
    wherein the cap insulating film is thicker than the second gate insulating film,
    wherein the cap insulating film includes silicon nitride, and
    wherein data of the memory cell is erased by injecting holes into the charge storage layer from the memory gate electrode.

2. The semiconductor device according to claim 1,
    wherein data is written to the memory cell by injecting electrons into the charge storage layer from the semiconductor substrate side.

3. The semiconductor device according to claim 2,
    wherein the electrons injected to the memory cell from the semiconductor substrate are hot electrons.

4. The semiconductor device according to claim 1,
    wherein the memory gate electrode is formed into the form of a sidewall.

5. The semiconductor device according to claim 1,
    wherein the second gate insulating film is formed by a laminated film including a lower layer insulating film, the charge storage layer formed over the lower layer insulating film, and an upper layer insulating film formed over the charge storage layer.

6. The semiconductor device according to claim 5,
    wherein the charge storage layer includes silicon nitride.

7. The semiconductor device according to claim 1,
wherein on the periphery of the memory cell, a p-channel type MISFET and an n-channel type MISFET are formed,
wherein the p-channel type MISFET has:
  a second well exhibiting an n-type conductivity formed in the semiconductor substrate;
  a third gate insulating film formed over the second well;
  a first gate electrode including a conductive film exhibiting a p-type conductivity; and
  a second source region exhibiting a p-type conductivity and a second drain region exhibiting a p-type conductivity,
wherein the n-channel type MISFET has:
  a third well exhibiting a p-type conductivity formed in the semiconductor substrate;
  a fourth gate insulating film formed over the third well;
  a second gate electrode including a conductive film exhibiting an n-type conductivity; and
  a third source region exhibiting an n-type conductivity and a third drain region exhibiting an n-type conductivity,
wherein over the memory cell and the p-channel type MISFET, a first insulating film having compression stress is formed, and
wherein over the n-channel type MISFET, a second insulating film having tensile stress is formed.

8. The semiconductor device according to claim 7,
wherein the first insulating film or the second insulating film is an insulting film used as an etching stopper when forming a self-alignment contact.

9. The semiconductor device according to claim 7,
wherein the first insulating film or the second insulating film includes silicon nitride.

10. The semiconductor device according to claim 7,
wherein over the first insulating film and the second insulating film, a third insulating film is formed,
wherein a first plug that reaches the first source region or the first drain region of the memory cell is formed in a laminated film including the first insulating film and the third insulating film,
wherein a second plug that reaches the second source region or the second drain region of the p-channel type MISFET is formed in a laminated film including the first insulating film and the third insulating film, and
wherein a plurality of third plugs that reach the third source region or the third drain region of the n-channel type MISFET is formed in a laminated film including the second insulating film and the third insulating film.

11. The semiconductor device according to claim 1,
wherein on the periphery of the memory cell, an n-channel type MISFET is formed,
wherein the n-channel type MISFET has:
  a third well exhibiting a p-type conductivity formed in the semiconductor substrate;
  a fourth gate insulating film formed over the third well;
  a second gate electrode including a conductive film exhibiting an n-type conductivity; and
  a third source region exhibiting an n-type conductivity and a third drain region exhibiting an n-type conductivity, and
wherein over the memory cell and the n-channel type MISFET, a fourth insulating film having tensile stress is formed.

12. The semiconductor device according to claim 11,
wherein the thickness of the cap insulating film is greater than the thickness of the fourth insulating film.

13. The semiconductor device according to claim 11,
wherein the fourth insulating film is an insulating film used as an etching stopper when forming a self-alignment contact.

14. The semiconductor device according to claim 11,
wherein the fourth insulating film includes silicon nitride.

15. The semiconductor device according to claim 11,
wherein over the fourth insulating film, a third insulating film is formed,
wherein a first plug that reaches the first source region of the memory cell is formed in a laminated film including the fourth insulating film and the third insulating film, and
wherein a third plug that reaches the third source region or the third drain region of the n-channel type MISFET is formed in a laminated film including the fourth insulating film and the third insulating film.

16. The semiconductor device according to claim 1,
wherein the cap insulating film causes compression stress to occur in a channel region under the selection gate electrode.

17. The semiconductor device according to claim 1,
wherein the injecting holes into the charge storage layer is performed by a Fowler-Nordheim tunnel current.

18. The semiconductor device according to claim 1,
wherein silicide layers are formed over the memory gate electrode, the first source region and the first drain region, and a silicide layer is not formed over the selection gate electrode.

* * * * *